(12) United States Patent
Kim et al.

(10) Patent No.: US 12,245,489 B2
(45) Date of Patent: Mar. 4, 2025

(54) DISPLAY DEVICE

(71) Applicant: Samsung Display Co., LTD., Yongin-si (KR)

(72) Inventors: Chan Young Kim, Yongin-si (KR); Yeong Ho Lee, Yongin-si (KR); Ha Seok Jeon, Yongin-si (KR); Jun Hee Lee, Yongin-si (KR); Choong Youl Im, Yongin-si (KR); Hyun Duck Cho, Yongin-si (KR); Kook Hyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/142,241

(22) Filed: May 2, 2023

(65) Prior Publication Data

US 2024/0122025 A1    Apr. 11, 2024

(30) Foreign Application Priority Data

Oct. 6, 2022    (KR) .................. 10-2022-0128175

(51) Int. Cl.
*H10K 59/40*       (2023.01)
*H10K 59/122*      (2023.01)
(Continued)

(52) U.S. Cl.
CPC .......... *H10K 59/40* (2023.02); *H10K 59/122* (2023.02); *H10K 59/38* (2023.02); *H10K 59/8792* (2023.02); *H10K 2102/311* (2023.02)

(58) Field of Classification Search
CPC ... G06F 3/0412; G06F 3/0445; H10K 50/125; H10K 50/844; H10K 50/858;
(Continued)

(56) References Cited

U.S. PATENT DOCUMENTS

| 10,734,452 B1* | 8/2020 | Kim ................. H10K 59/40 |
| 2011/0043096 A1* | 2/2011 | Asaki ............... H10K 59/8792 313/483 |

(Continued)

FOREIGN PATENT DOCUMENTS

| KR | 20180125674 | 11/2018 |
| KR | 20220034590 | 3/2022 |

*Primary Examiner* — Matthew A Eason
*Assistant Examiner* — Sujit Shah
(74) *Attorney, Agent, or Firm* — CANTOR COLBURN LLP

(57) ABSTRACT

A display device includes: a pixel defining layer defining openings arranged in first and second directions, the openings forming emission areas in which light emitting elements are disposed to emit light of different colors; a light blocking layer disposed on the pixel defining layer, and defining holes, each overlapping the opening and having a larger diameter than the opening; and color filters disposed on the light blocking layer to overlap the holes and overlap the emission areas. The opening has an opening interval, which is defined as a difference in diameter between the overlapping hole and the opening, in the openings, among homogeneous openings in which the light emitting elements for emitting light of the same color are disposed, the homogeneous openings adjacent in the first or second direction have different opening intervals, and among the homogeneous openings, openings having different opening intervals are at least three types.

28 Claims, 27 Drawing Sheets

(51) Int. Cl.
*H10K 59/38* (2023.01)
*H10K 59/80* (2023.01)
*H10K 102/00* (2023.01)

(58) Field of Classification Search
CPC .... H10K 59/122; H10K 59/35; H10K 59/353; H10K 59/40; H10K 59/38; H10K 59/8792; H10K 59/311; H10K 50/865; H10K 59/873; H10K 2102/311; H10K 59/124; H10K 59/80521; G09G 2300/0452; G09G 3/3233; G09G 2300/0413; G09G 2300/02; G09G 3/2074
See application file for complete search history.

(56) References Cited

U.S. PATENT DOCUMENTS

| | | | |
|---|---|---|---|
| 2019/0245017 A1* | 8/2019 | Jeon | H10K 59/352 |
| 2021/0013275 A1* | 1/2021 | Kim | H10K 50/82 |
| 2021/0264823 A1* | 8/2021 | Heo | H01L 27/1214 |
| 2022/0052298 A1* | 2/2022 | Ge | H10K 50/858 |

* cited by examiner

DISPLAY DEVICE

This application claims priority to Korean Patent Application No. 10-2022-0128175, filed on Oct. 6, 2022, and all the benefits accruing therefrom under 35 U.S.C. 119, the contents of which in its entirety are herein incorporated by reference.

BACKGROUND

1. Technical Field

The disclosure relates to a display device.

2. Description of the Related Art

With the advance of information-oriented society, more and more demands are placed on a display device for displaying images in various ways. For example, the display device is employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image can be displayed without a backlight unit providing light to the display panel.

A recent display device supports touch input using a user's body part (e.g., a finger) and input using an input pen. The input using the input pen allows the display device to detect the input more sensitively than the input using only a part of a user's body.

SUMMARY

Aspects of the disclosure provide a display device including a color filter disposed on a light emitting element, and capable of reducing reflected light due to external light by the overlapping of the color filters.

Aspects of the disclosure also provide a display device capable of reducing a diffraction pattern caused by external light by adjusting an interval between an emission area and openings of a light blocking layer.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device includes: a plurality of pixels including a plurality of emission areas in which light emitting elements for emitting light are disposed and arranged in a first direction and a second direction crossing the first direction and; a light blocking layer disposed between the emission areas adjacent to each other, and defining a plurality of holes, where each of the holes overlaps a corresponding emission area of the emission areas and has a different diameter from the corresponding emission area; and a plurality of color filters disposed in the holes of the light blocking layer and overlapping the emission areas. The emission areas include a plurality of first emission areas for emitting light of a first color, a plurality of second emission areas for emitting light of a second color having a shorter wavelength band than the light of the first color, and a plurality of third emission areas for emitting light of a third color having a wavelength band between the light of the first color and the light of the second color, the plurality of holes includes first holes overlapping the first emission areas, second holes overlapping the second emission areas, and third holes overlapping the third emission areas, and in one of the pixels in a plan view, a first opening interval between a corresponding first emission area of the first emission areas and a corresponding first hole of the first holes, a second opening interval between a corresponding second emission area of the second emission areas and a corresponding second hole of the second holes, and a third opening interval between a corresponding third emission area of the third emission areas and a corresponding third hole of the third holes are different from each other.

In the plurality of pixels, the emission areas for emitting light of the same color may have different opening intervals, and among the emission areas for emitting light of the same color, the emission areas having different opening intervals may be at least three types of emission areas.

In the plurality of emission areas arranged in the first direction or the second direction, the emission areas adjacent to each other in the first direction or the second direction and for emitting light of the same color may have different opening intervals.

Diameters of the first emission area, the second emission area, and the third emission area may be different from each other.

The first opening interval, the second opening interval, and the third opening interval may each be in a range of about 3 micrometers (μm) to about 10 μm.

A difference in opening intervals of the emission areas for emitting light of the same color may be in a range of about 0.5 μm to about 1 μm.

A difference in the opening intervals of the emission areas for emitting light of the same color may be constant.

A difference between a minimum opening interval and an intermediate opening interval among the opening intervals of the emission areas for emitting light of the same color may be different from a difference between the intermediate opening interval and a maximum opening interval among the opening intervals of the emission areas for emitting light of the same color.

A minimum opening interval among first opening intervals of the first emission areas may be equal to each of a minimum opening interval among second opening intervals of the second emission areas and a minimum opening interval among third opening intervals of the third emission areas.

An opening interval deviation of the first opening intervals may be equal to each of an opening interval deviation of the second opening intervals and an opening interval deviation of the third opening intervals.

An opening interval deviation of the first opening intervals may be different from each of an opening interval deviation of the second opening intervals and an opening interval deviation of the third opening intervals.

A ratio of the opening interval deviation of the first opening intervals, the opening interval deviation of the second opening intervals, and the opening interval deviation of the third opening intervals may be 1:0.73:0.86.

A polarization layer may be not disposed on the plurality of pixels.

The plurality of color filters may be disposed to overlap the emission areas which emit light of the same color, but have different opening intervals, and the plurality of color filters overlapping the emission areas having different opening intervals may include middle portions having different thicknesses.

According to an embodiment of the disclosure, a display device includes: a pixel defining layer including a plurality of openings therein arranged in a first direction and a second direction crossing the first direction, the plurality of openings forming a plurality of emission areas in which a plurality of light emitting elements are disposed to emit light of different colors, a light blocking layer disposed on the pixel defining layer, and defining a plurality of holes therein, where each of the holes overlaps a corresponding opening of the openings and has a larger diameter than the corresponding opening, and a plurality of color filters disposed on the light blocking layer to overlap the holes and overlap the emission areas, where the corresponding opening has an opening interval, which is defined as a difference in diameter between the overlapping hole and the corresponding opening, in the plurality of openings, among homogeneous openings in which the light emitting elements for emitting light of the same color are disposed, the homogeneous openings adjacent in the first direction or the second direction have different opening intervals, and among the homogeneous openings, openings having different opening intervals are at least three types of openings.

A difference in the opening intervals between the openings having the different opening intervals among the homogeneous openings may be in a range of about 0.5 μm to about 1 μm.

A difference in the opening intervals between the openings having the different opening intervals among the homogeneous openings may be constant.

The plurality of openings may include a plurality of first openings in each of which a first light emitting element for emitting light of a first color is disposed, and a plurality of second openings in each of which a second light emitting element for emitting light of a second color different from the first color is disposed and having a different diameter from the first opening, the plurality of first openings may include homogeneous first openings having different opening intervals, and the plurality of second openings may include homogeneous second openings having different opening intervals.

The opening interval of each of the homogeneous first openings may be equal to the opening interval of each of the homogeneous second openings.

A deviation in the opening interval of the homogeneous first openings may be different from a deviation in the opening interval of the homogeneous second openings.

The opening interval of each of the homogeneous first openings may be different from the opening interval of each of the homogeneous second openings.

A deviation in the opening interval of the homogeneous first openings may be equal to a deviation in the opening interval of the homogeneous second openings.

A polarization layer may be not disposed on the pixel defining layer.

The plurality of color filters may include a plurality of first color filters disposed on the plurality of first openings, and the plurality of first color filters disposed on the homogeneous first openings having different opening intervals may include middle portions having different thicknesses.

The display device according to one embodiment may induce destructive interference of diffracted light by adjusting the opening interval between the emission area and holes, and may lower the light transmittance of the reflected light by increasing the thickness of the color filter. Accordingly, the display device may prevent the reflected light by the external light from being visually recognized as a pattern, and may provide a more comfortable feeling of use.

However, effects according to the embodiments of the disclosure are not limited to those exemplified above and various other effects are incorporated herein.

BRIEF DESCRIPTION OF THE DRAWINGS

The above and other aspects and features of the disclosure will become more apparent by describing in detail embodiments thereof with reference to the attached drawings, in which.

DETAILED DESCRIPTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments will be described with reference to the accompanying drawings.

Figure 1:
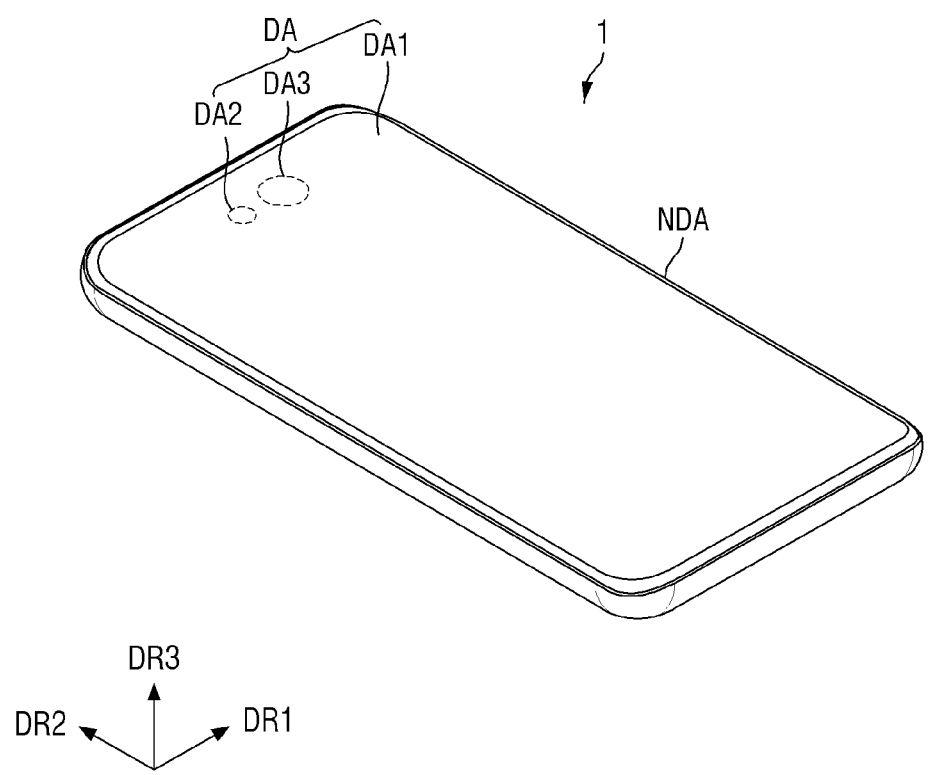
FIG. 1 is a schematic perspective view of a display device according to one embodiment.

FIG. 1 is a schematic perspective view of a display device according to one embodiment.

Referring to FIG. 1, an electronic device 1 displays a moving image or a still image. The electronic device 1 may refer to any electronic device providing a display screen. Examples of the electronic device 1 may include a television, a laptop computer, a monitor, a billboard, an Internet-of-Things device, a mobile phone, a smartphone, a tablet personal computer ("PC"), an electronic watch, a smart watch, a watch phone, a head-mounted display, a mobile communication terminal, an electronic notebook, an electronic book, a portable multimedia player ("PMP"), a navigation device, a game machine, a digital camera, a camcorder and the like, which provide a display screen.

Figure 4:
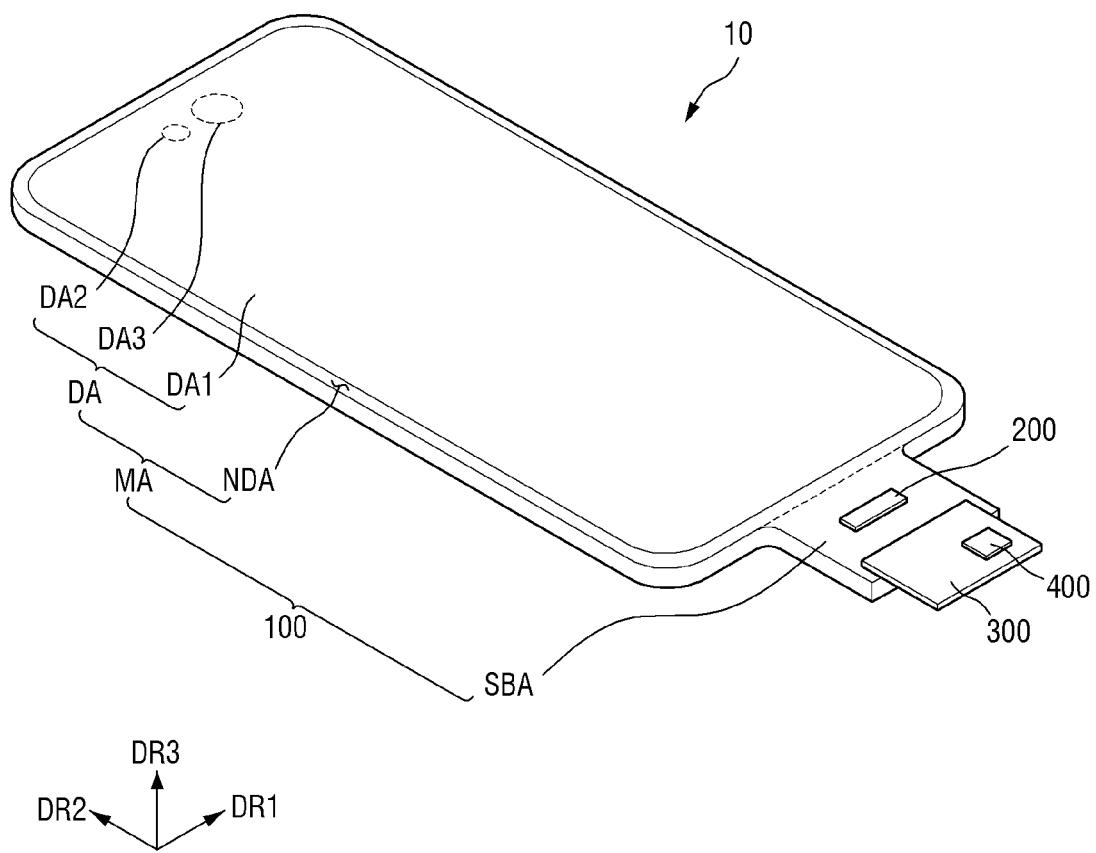
FIG. 4 is a perspective view illustrating a display device included in an electronic device according to one embodiment.

The electronic device 1 may include a display device 10 in FIG. 4 providing a display screen. Examples of the display device may include an inorganic light emitting diode display device, an organic light emitting display device, a quantum dot light emitting display device, a plasma display device and a field emission display device. In the following description, a case where an organic light emitting diode display device is applied as a display device will be exemplified, but the disclosure is not limited thereto, and other display devices may be applied within the same scope of technical spirit.

The shape of the electronic device 1 may be variously modified. For example, the electronic device 1 may have a shape such as a rectangular shape elongated in a horizontal direction, a rectangular shape elongated in a vertical direction, a square shape, a quadrilateral shape with rounded corners (vertices), other polygonal shapes and a circular shape. The shape of a display area DA of the electronic device 1 may also be similar to the overall shape of the electronic device 1. FIG. 1 illustrates the electronic device 1 having a rectangular shape elongated in a second direction DR2.

The electronic device 1 may include the display area DA and a non-display area NDA. The display area DA is an area where a screen can be displayed, and the non-display area NDA is an area where a screen is not displayed. The display area DA may also be referred to as an active region, and the non-display area NDA may also be referred to as a non-active region. The display area DA may substantially occupy the center of the electronic device 1.

The display area DA may include a first display area DA1, a second display area DA2, and a third display area DA3. The second display area DA2 and the third display area DA3 are areas in which components for adding various functions to the electronic device 1 are disposed, and the second display area DA2 and the third display area DA3 may correspond to a component area.

Figure 2:
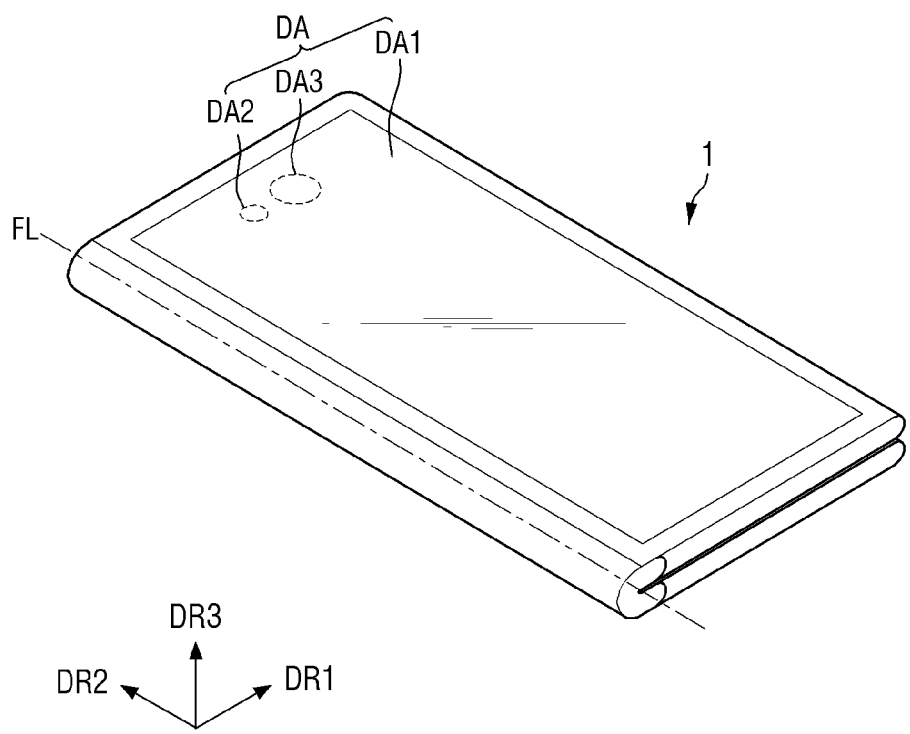
FIG. 2 is a perspective view illustrating a foldable display device in a folded state according to one embodiment.
Figure 3:
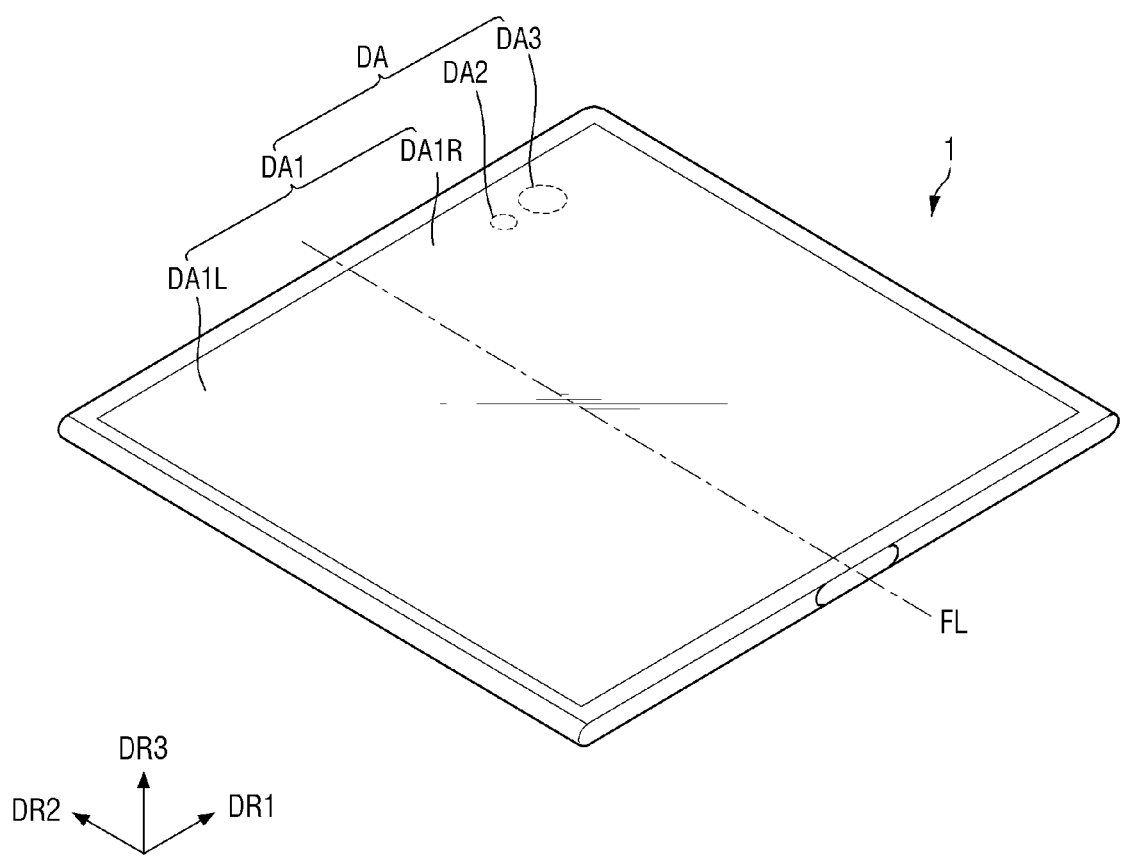
FIG. 3 is a perspective view illustrating the foldable display device of FIG. 2 in an unfolded state.

FIG. 2 is a perspective view illustrating a foldable display device in a folded state according to one embodiment. FIG. 3 is a perspective view illustrating the foldable display device of FIG. 2 in an unfolded state.

Referring to FIGS. 2 and 3, the electronic device 1 according to one embodiment may be a foldable display device. The foldable electronic device 1 may be folded around a folding axis FDL. The display area DA may be disposed outside and/or inside of the foldable electronic device 1. In one embodiment, the foldable electronic device 1 of FIGS. 2 and 3 illustrates that the display area DA is disposed on each of the outside and the inside.

The display area DA may be disposed outside the electronic device 1. An outer surface of the folded electronic device 1 may include the display area DA, and an inner surface of the unfolded electronic device 1 may include the display area DA. In the foldable electronic device 1 of FIG. 3, the display area DA may include a first display area DA1 that occupies most of the display area DA, and a second display area DA2 and a third display area DA3 that occupy relatively smaller areas than the first display area DA1. The first display area DA1 may include a first display portion DA1L and a second display portion DA1R positioned on both sides of the folding axis FDL. Each of the second display area DA2 and the third display area DA3 may be disposed in the area in which the second display portion DA1R is positioned, but is not limited thereto. In another embodiment, each of the second display area DA2 and the third display area DA3 may be disposed in the area in which the first display portion DA1L is positioned, or one of the second display area DA2 and the third display area DA3 may be disposed on the first display portion DA1L and the other may also be disposed on the second display portion DA1R.

As illustrated in FIGS. 1 to 3, each of the second display area DA2 and the third display area DA3 may have a smaller area than the first display area DA1. The second display area DA2 and the third display area DA3 may have different sizes or areas, but are not limited thereto. In the following drawings, a case in which the second display area DA2 has a smaller area than the third display area DA3 is exemplified. Each of the second display area DA2 and the third display area DA3 may be surrounded by the first display area DA1. However, the disclosure is not limited thereto.

FIG. 4 is a perspective view illustrating a display device included in an electronic device according to one embodiment.

Referring to FIG. 4, the electronic device 1 according to one embodiment may include the display device 10. The display device 10 may provide a screen displayed by the electronic device 1. The display device 10 may have a planar shape similar to the shape of the electronic device 1. For example, the display device 10 may have a shape similar to a rectangular shape having a short side in the first direction DR1 and a long side in the second direction DR2. The edge where the short side in the first direction DR1 and the long side in the second direction DR2 meet may be rounded to have a curvature, but is not limited thereto and may be formed at a right angle. The planar shape of the display device 10 is not limited to a quadrilateral shape, and may be formed in a shape similar to another polygonal shape, a circular shape, or elliptical shape.

The display device 10 may include the display panel 100, the display driver 200, the circuit board 300, and the touch driver 400.

The display panel 100 may include a main region MA and a sub-region SBA.

The main region MA may include the display area DA including pixels displaying an image and the non-display area NDA disposed around the display area DA. The display area DA may include the first display area DA1, the second display area DA2, and the third display area DA3. The display area DA may emit light from a plurality of emission areas or a plurality of opening areas. For example, the display panel 100 may include a pixel circuit including switching elements, a pixel defining layer defining an emission area or an opening area, and a self-light emitting element.

For example, the self-light emitting element may include at least one of an organic light emitting diode ("LED") including an organic light emitting layer, a quantum dot LED including a quantum dot light emitting layer, an inorganic LED including an inorganic semiconductor, or a micro LED, but is not limited thereto.

The non-display area NDA may be an area outside the display area DA. The non-display area NDA may be defined as an edge area of the main region MA of the display panel 100. The non-display area NDA may include a gate driver (not illustrated) that supplies gate signals to the gate lines, and fan-out lines (not illustrated) that connect the display driver 200 to the display area DA.

The sub-region SBA may be a region extending from one side of the main region MA. The sub-region SBA may include a flexible material which can be bent, folded or rolled. For example, when the sub-region SBA is bent, the sub-region SBA may overlap the main region MA in a thickness direction (third direction DR3). The sub-region SBA may include the display driver 200 and the pad unit connected to the circuit board 300. In another embodiment, the sub-region SBA may be omitted, and the display driver 200 and the pad unit may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the gate driver. The display driver 200 may be formed as an integrated circuit ("IC") and mounted on the display panel 100 by a chip on glass ("COG") method, a chip on plastic ("COP") method, or an ultrasonic bonding method. For example, the display driver 200 may be disposed in the sub-region SBA, and may overlap the main region MA in the thickness direction by bending of the sub-region SBA. For another example, the display driver 200 may be mounted on the circuit board 300.

The circuit board 300 may be attached to the pad unit of the display panel 100 by using an anisotropic conductive film ("ACF"). Lead lines of the circuit board 300 may be electrically connected to a pad unit of the display panel 100. The circuit board 300 may be a flexible printed circuit board, a printed circuit board, or a flexible film such as a chip on film.

A touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and may sense an amount of change in capacitance between the plurality of touch electrodes. For example, the touch driving signal may be a pulse signal having a predetermined frequency. The touch driver 400 may calculate whether an input is made and input coordinates based on an amount of change in capacitance between the plurality of touch electrodes. The touch driver 400 may be formed of an integrated circuit (IC).

Figure 5:
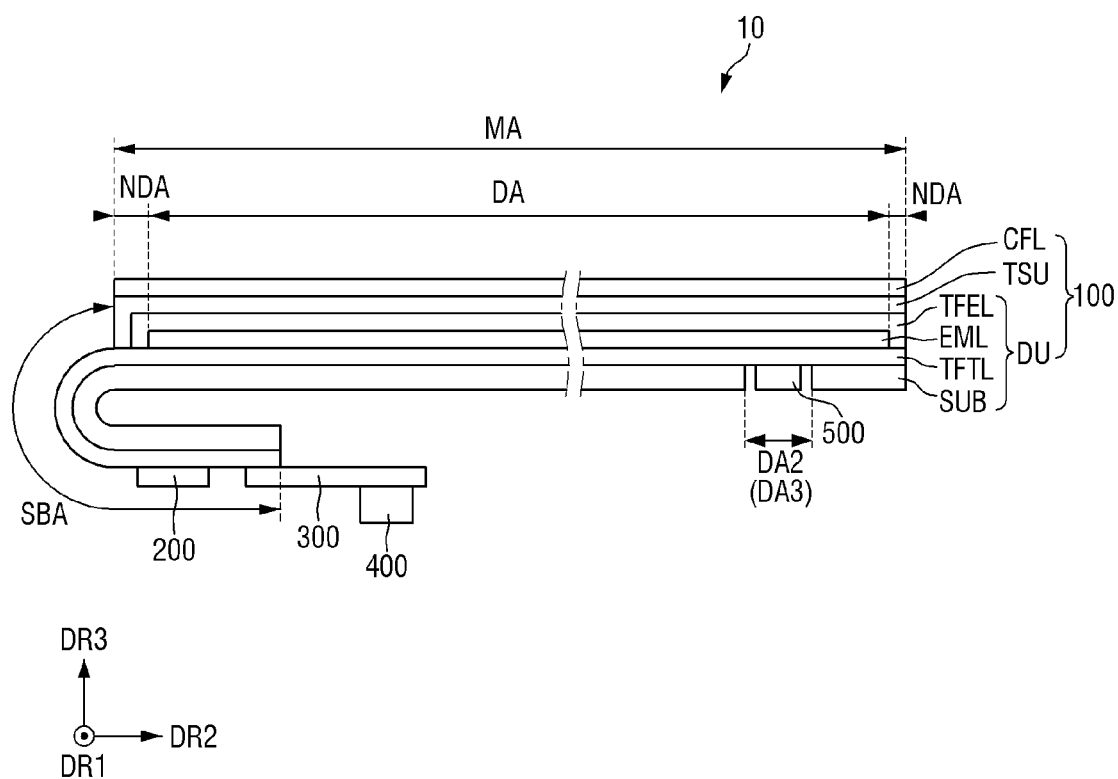
FIG. 5 is a cross-sectional view of the display device of FIG. 4 viewed from the side.

FIG. 5 is a cross-sectional view of the display device of FIG. 4 viewed from the side.

Referring to FIG. 5, the display panel 100 may include a display layer DU, a touch sensing layer TSU, and a color filter layer CFL. The display layer DU may include the substrate SUB, the thin film transistor layer TFTL, the light emitting element layer EML, and the encapsulation layer TFEL.

The substrate SUB may be a base substrate or a base member. The substrate SUB may be a flexible substrate which can be bent, folded or rolled. For example, the substrate SUB may include a polymer resin such as polyimide ("PI"), but is not limited thereto. In another embodiment, the substrate SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines that connect the display driver 200 to the data lines, and lead lines that connect the display driver 200 to the pad unit. Each of the thin film transistors may include a semiconductor region, a source electrode, a drain electrode, and a gate electrode. For example, when the gate driver is formed on one side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements each including a first electrode, a second electrode, and a light emitting layer to emit light, and a pixel defining layer defining pixels. The plurality of light emitting elements of the light emitting element layer EML may be disposed in the display area DA.

In one embodiment, the light emitting layer may be an organic light emitting layer including an organic material. The light emitting layer may include a hole transporting layer, an organic light emitting layer, and an electron transporting layer. When the first electrode receives a voltage through the thin film transistor of the thin film transistor layer TFTL and the second electrode receives the cathode voltage, holes and electrons may be transferred to the organic light emitting layer through the hole transporting layer and the electron transporting layer, respectively and may be combined with each other to emit light in the organic light emitting layer.

In another embodiment, the light emitting elements may include a quantum dot light emitting diode including a quantum dot light emitting layer, an inorganic light emitting diode including an inorganic semiconductor, or a micro light emitting diode.

The encapsulation layer TFEL may cover the top surface and the side surface of the light emitting element layer EML, and may protect the light emitting element layer EML. The encapsulation layer TFEL may include at least one inorganic layer and at least one organic layer for encapsulating the light emitting element layer EML.

The touch sensing layer TSU may be disposed on the encapsulation layer TFEL. The touch sensing layer TSU may include a plurality of touch electrodes for sensing a user's touch in a capacitive manner, and touch lines connecting the plurality of touch electrodes to the touch driver 400. For example, the touch sensing layer TSU may sense the user's touch by using a mutual capacitance method or a self-capacitance method.

In another embodiment, the touch sensing layer TSU may be disposed on a separate substrate disposed on the display layer DU. In this case, the substrate supporting the touch sensing layer TSU may be a base member that encapsulates the display layer DU.

The plurality of touch electrodes of the touch sensing layer TSU may be disposed in a touch sensor area overlapping the display area DA. The touch lines of the touch sensing layer TSU may be disposed in a touch peripheral area that overlaps the non-display area NDA.

The color filter layer CFL may be disposed on the touch sensing layer TSU. The color filter layer CFL may include a plurality of color filters respectively corresponding to the plurality of emission areas. Each of the color filters may selectively transmit light of a specific wavelength and may block or absorb light of a different wavelength. The color filter layer CFL may absorb a part of light coming from the outside of the display device 10 to reduce reflected light due to external light. Accordingly, the color filter layer CFL may prevent color distortion caused by reflection of the external light.

Since the color filter layer CFL is directly disposed on the touch sensing layer TSU, the display device 10 may not require a separate substrate for the color filter layer CFL. Accordingly, the thickness of the display device 10 may be relatively small.

In some embodiments, the display device 10 may further include an optical device 500. The optical device 500 may be disposed in the second display area DA2 or the third display area DA3. The optical device 500 may emit or receive light in infrared, ultraviolet, and visible light bands. For example, the optical device 500 may be an optical sensor that detects light incident on the display device 10 such as a proximity sensor, an illuminance sensor, and a camera sensor or an image sensor.

Figure 6:
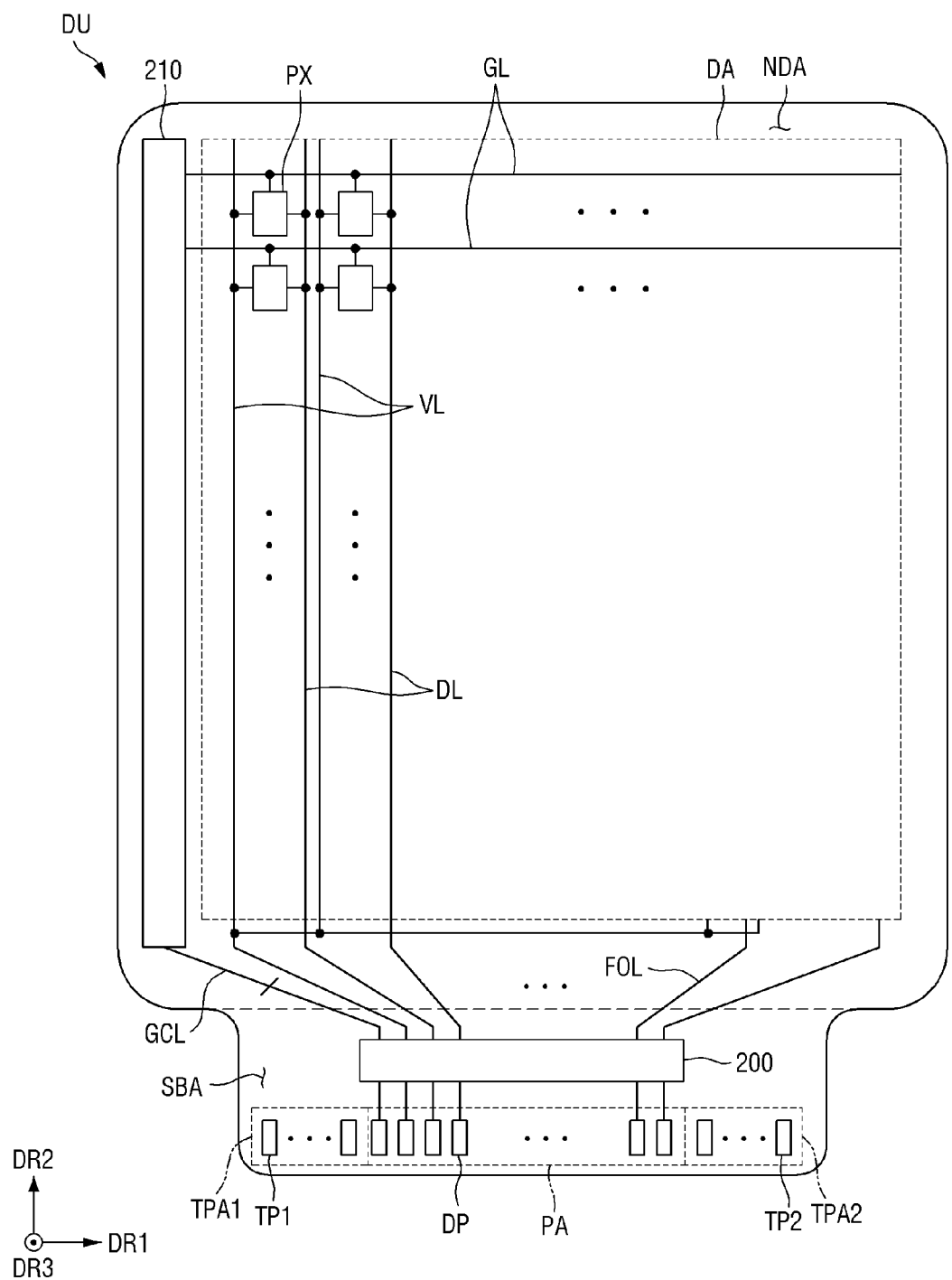
FIG. 6 is a plan view illustrating a display layer of a display device according to one embodiment.

FIG. 6 is a plan view illustrating a display layer of a display device according to one embodiment.

Referring to FIG. 6, the display layer DU may include the display area DA and the non-display area NDA.

The display area DA may be disposed at the center of the display panel 100. A plurality of pixels PX, a plurality of gate lines GL, a plurality of data lines DL, and a plurality of power lines VL may be disposed in the display area DA. Each of the plurality of pixels PX may be defined as a minimum unit that emits light.

The plurality of gate lines GL may supply the gate signals received from the gate driver 210 to the plurality of pixels PX. The plurality of gate lines GL may extend in the first direction DR1 and may be spaced apart from each other in the second direction DR2 intersecting the first direction DR1.

The plurality of data lines DL may supply the data voltages received from the display driver 200 to the plurality of pixels PX. The plurality of data lines DL may extend in the second direction DR2 and may be spaced apart from each other in the first direction DR1.

The plurality of power lines VL may supply the power voltage received from the display driver 200 to the plurality of pixels PX. Here, the power voltage may be at least one of a driving voltage, an initialization voltage, a reference voltage, or a low potential voltage. The plurality of power lines VL may extend in the second direction DR2 and may be spaced apart from each other in the first direction DR1.

The non-display area NDA may surround the display area DA. A gate driver 210, fan-out lines FOL, and gate control lines GCL may be disposed in the non-display area NDA. The gate driver 210 may generate a plurality of gate signals based on the gate control signal, and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a pad area PA, and first and second touch pad areas TPA1 and TPA2.

The display driver 200 may output signals and voltages for driving the display panel 100 to the fan-out lines FOL. The display driver 200 may supply a data voltage to the data line DL through the fan-out lines FOL. The data voltage may be supplied to the plurality of pixels PX, and the luminance of the plurality of pixels PX may be controlled. The display driver 200 may supply the gate control signal to the gate driver 210 through the gate control line GCL.

The pad area PA, the first touch pad area TPA1, and the second touch pad area TPA2 may be disposed at the edge of the sub-region SBA. The pad area PA, the first touch pad area TPA1, and the second touch pad area TPA2 may be electrically connected to the circuit board 300 by using a material such as self assembly anisotropic conductive paste ("SAP") or an anisotropic conductive film.

The pad area PA may include a plurality of display pad units DP. The plurality of display pad units DP may be connected to a graphic system through the circuit board 300. The plurality of display pad units DP may be connected to the circuit board 300 to receive digital video data, and may supply the digital video data to the display driver 200.

Figure 7:
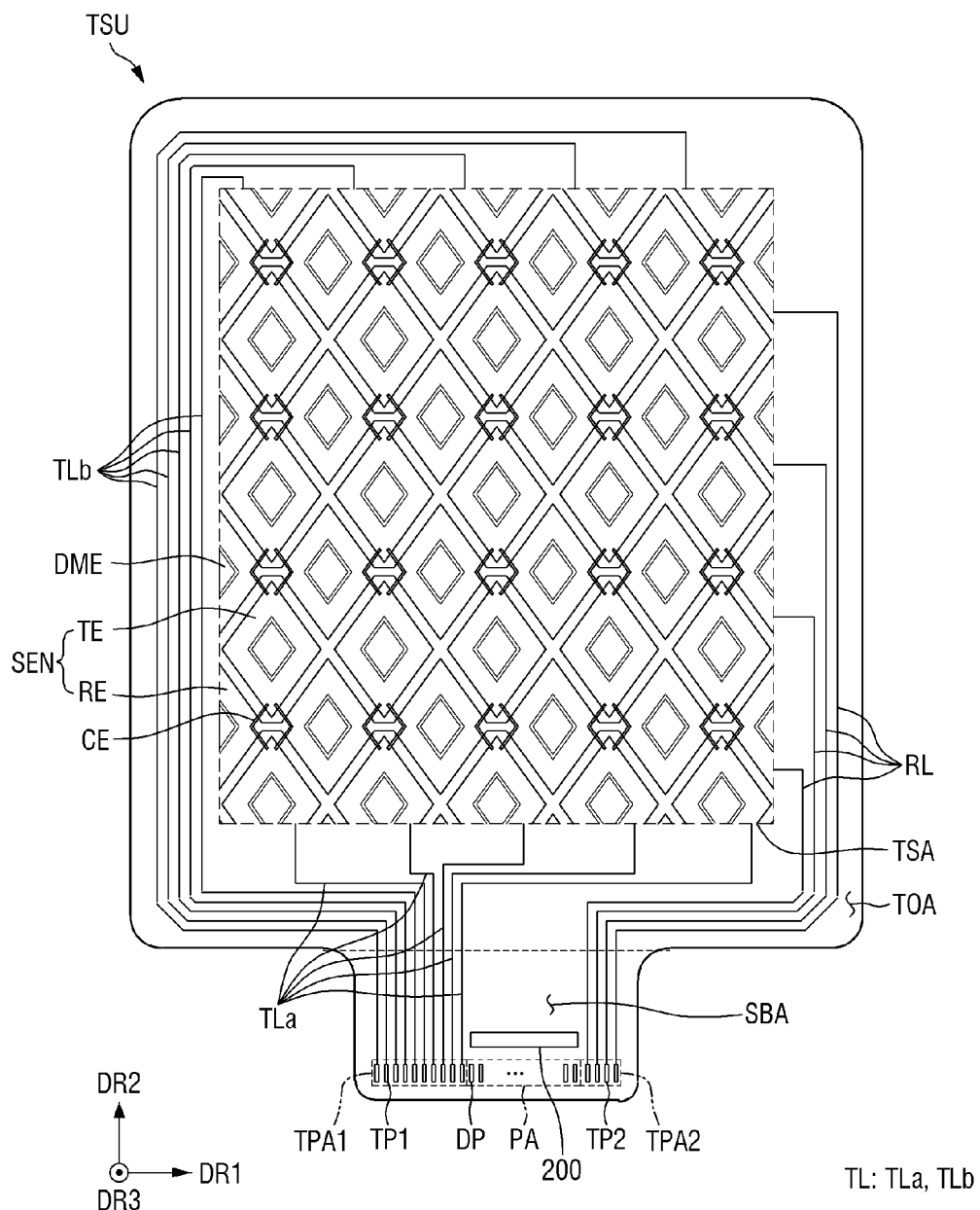
FIG. 7 is a plan view illustrating a touch sensing layer of a display device according to one embodiment.

FIG. 7 is a plan view illustrating a touch sensing layer of a display device according to one embodiment.

Referring to FIG. 7, the touch sensing layer TSU may include a touch sensor area TSA for sensing a user's touch, and a touch peripheral area TOA disposed around the touch sensor area TSA. The touch sensor area TSA may be disposed in the display area DA of the display device 10, and the touch peripheral area TOA may be disposed in the non-display area NDA of the display device 10.

The touch sensor area TSA may include a plurality of touch electrodes SEN and a plurality of dummy electrodes DME. The plurality of touch electrodes SEN may form mutual capacitance or self-capacitance to sense a touch of an object or a person. The plurality of touch electrodes SEN may include a plurality of driving electrodes TE and a plurality of sensing electrodes RE.

The plurality of driving electrodes TE may be arranged in the first direction DR1 and the second direction DR2. The plurality of driving electrodes TE may be spaced apart from each other in the first direction DR1 and the second direction DR2. The driving electrodes TE adjacent in the second direction DR2 may be electrically connected through a bridge electrode CE.

The plurality of driving electrodes TE may be connected to a first touch pad unit TP1 through a driving line TDL. The driving line TDL may include a lower driving line TLa and an upper driving line TLb. For example, the driving electrodes TE disposed under the touch sensor area TSA may be connected to the first touch pad unit TP1 through the lower driving line TLa, and the driving electrodes TE disposed on the upper side of the touch sensor area TSA may be connected to the first touch pad unit TP1 through the upper driving line TLb. The lower driving line TLa may extend to the first touch pad unit TP1 through the lower side of the touch peripheral area TOA. The upper driving line TLb may extend to the first touch pad unit TP1 through the upper side, the left side, and the lower side of the touch peripheral area TOA. The first touch pad unit TP1 may be connected to the touch driver 400 through the circuit board 300.

The bridge electrode CE may be bent at least once. For example, the bridge electrode CE may have an angle bracket shape ("<" or ">"), but the planar shape of the bridge electrode CE is not limited thereto. The driving electrodes TE adjacent to each other in the second direction (Y-axis direction) may be connected by a plurality of bridge electrodes CE, and although any one of the bridge electrodes CE is disconnected, the driving electrodes TE may be stably connected through the remaining bridge electrode CE. The driving electrodes TE adjacent to each other may be connected by two bridge electrodes CE, but the number of bridge electrodes CE is not limited thereto.

The bridge electrode CE may be disposed on a different layer from the plurality of driving electrodes TE and the plurality of sensing electrodes RE. The sensing electrodes RE adjacent to each other in the first direction DR1 may be electrically connected through a connection portion disposed on the same layer as the plurality of driving electrodes TE or the plurality of sensing electrodes RE, and the driving electrodes TE adjacent in the second direction DR2 may be electrically connected through the bridge electrode CE disposed on a different layer from the plurality of driving electrodes TE or the plurality of sensing electrodes RE. Accordingly, although the bridge electrode CE overlaps the plurality of sensing electrodes RE in the Z-axis direction, the plurality of driving electrodes TE and the plurality of sensing electrodes RE may be insulated from each other. Mutual capacitance may be formed between the driving electrode TE and the sensing electrode RE.

The plurality of sensing electrodes RE may extend in the first direction DR1 and may be spaced apart from each other in the second direction DR2. The plurality of sensing electrodes RE may be arranged in the first direction DR1 and the second direction DR2, and the sensing electrodes RE adjacent in the first direction DR1 may be electrically connected through the connection portion.

The plurality of sensing electrodes RE may be connected to a second touch pad unit TP2 through a sensing line RL. For example, the sensing electrodes RE disposed on the right side of the touch sensor area TSA may be connected to the second touch pad unit TP2 through the sensing line RL. The sensing line RL may extend to the second touch pad unit TP2 through the right side and the lower side of the touch peripheral area TOA. The second touch pad unit TP2 may be connected to the touch driver 400 through the circuit board 300.

Each of the plurality of dummy electrodes DME may be surrounded by the driving electrode TE or the sensing electrode RE. Each of the dummy electrodes DME may be insulated by being spaced apart from the driving electrode TE or the sensing electrode RE. Accordingly, the dummy electrode DME may be electrically floating.

The pad area PA, the first touch pad area TPA1, and the second touch pad area TPA2 may be disposed at the edge of the sub-region SBA. The pad area PA, the first touch pad area TPA1, and the second touch pad area TPA2 may be electrically connected to the circuit board 300 by using a low-resistance high-reliability material such as self assembly anisotropic conductive paste (SAP) or an anisotropic conductive film.

The first touch pad area TPA1 may be disposed on one side of the pad area PA, and may include a plurality of first touch pad units TP1. The plurality of first touch pad units TP1 may be electrically connected to the touch driver 400 disposed on the circuit board 300. The plurality of first touch pad units TP1 may supply a touch driving signal to the plurality of driving electrodes TE through a plurality of driving lines TDL.

The second touch pad area TPA2 may be disposed on the other side of the pad area PA, and may include a plurality of second touch pad units TP2. The plurality of second touch pad units TP2 may be electrically connected to the touch driver 400 disposed on the circuit board 300. The touch driver 400 may receive a touch sensing signal through a plurality of sensing lines RL connected to the plurality of second touch pad units TP2, and may sense a change in mutual capacitance between the driving electrode TE and the sensing electrode RE.

In another embodiment, the touch driver 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driver 400 may sense an amount of change in electric charge of each of the plurality of driving electrodes TE and the plurality of sensing electrodes RE based on the touch sensing signal.

Figure 8:
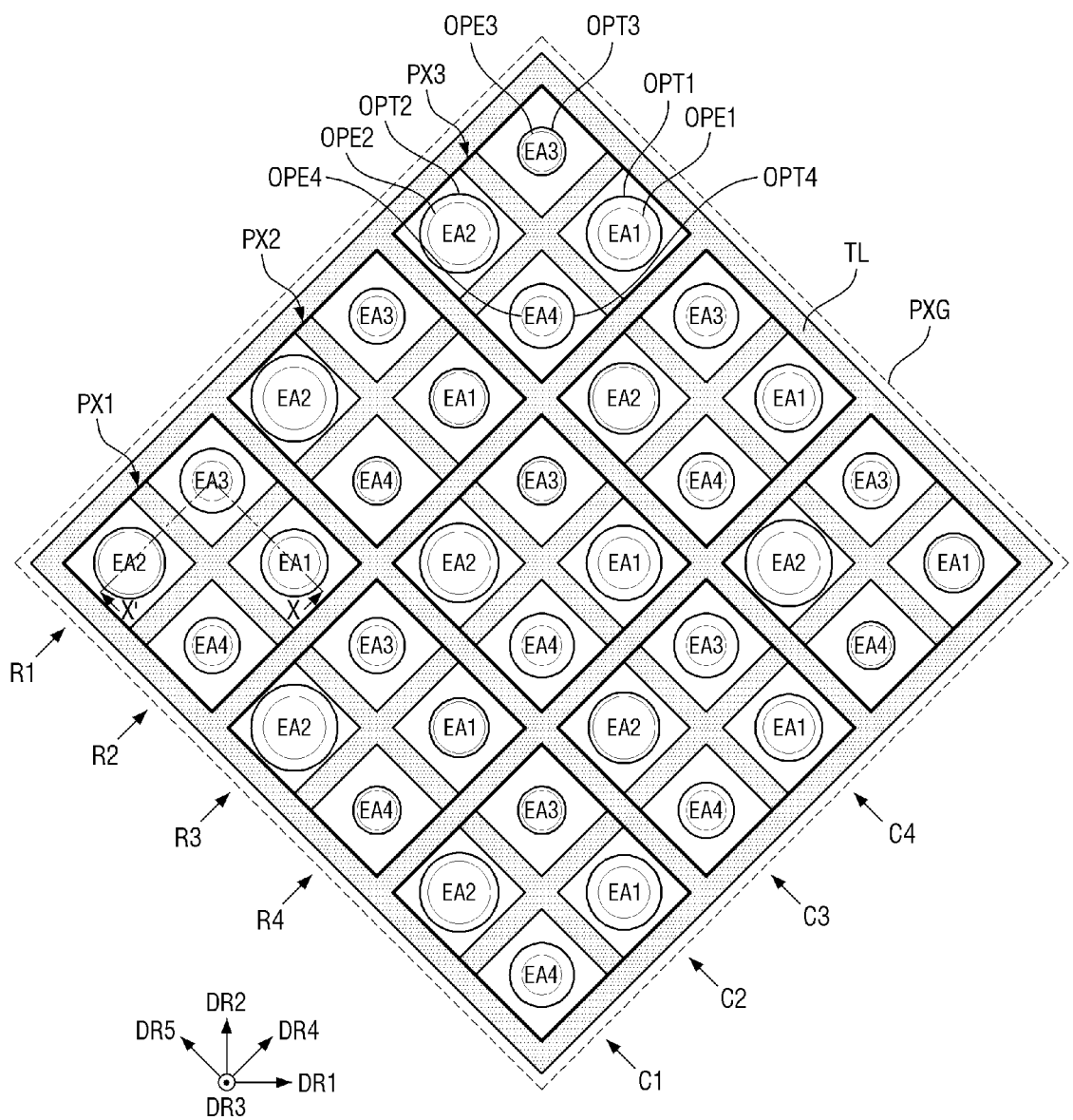
FIG. 8 is a plan view of the disposition of the emission areas in the first display area of the display device according to one embodiment.
Figure 9:
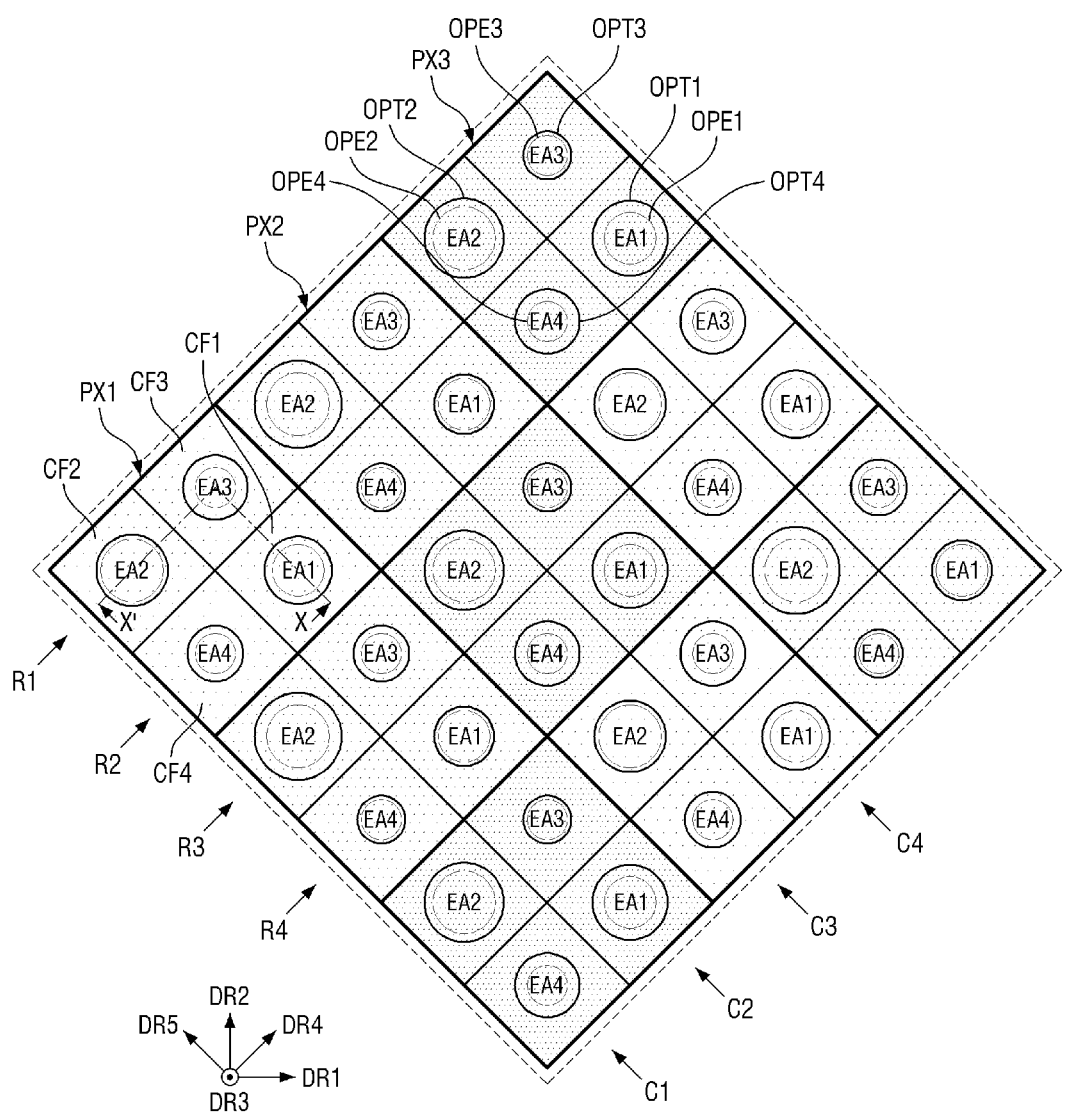
FIG. 9 is a plan view illustrating the disposition of color filters disposed in the first display area of FIG. 8.

FIG. 8 is a plan view of the disposition of the emission areas in the first display area of the display device according to one embodiment. FIG. 9 is a plan view illustrating the disposition of color filters disposed in the first display area of FIG. 8.

Referring to FIGS. 8 and 9, the display device 10 may include a plurality of pixels PX1, PX2, and PX3 disposed in the display area DA and emission areas EA1, EA2, EA3, and EA4 disposed in each of the pixels PX1, PX2, and PX3. The display area DA illustrated in FIGS. 8 and 9 is the first display area DA1, and the plurality of pixels PX1, PX2, and PX3 and the emission areas EA1, EA2, and EA3 may be disposed in the first display area DA1. However, the plurality of pixels PX1, PX2, and PX3 and the emission areas EA1, EA2, EA3, and EA4 may be disposed also in the second display area DA2 and the third display area DA3 of the display area DA.

The plurality of pixels PX1, PX2, and PX3 may be arranged in a fourth direction DR4 and a fifth direction DR5 between the first direction DR1 and the second direction DR2. The first pixel PX1, the second pixel PX2, and the third pixel PX3 may be alternately disposed along the fourth direction DR4 and the fifth direction DR5. For example, the second pixel PX2 and the third pixel PX3 may be arranged in the fourth direction DR4 and the fifth direction DR5 with respect to the first pixel PX1. The plurality of pixels PX1, PX2, and PX3 may be disposed in a Pentile™ type, for example, a diamond Pentile™ type in the display area DA. However, the disposition or arrangement of the pixels PX1, PX2, and PX3 is not limited to those illustrated in FIGS. 5 and 6. In some embodiments, the plurality of pixels PX1, PX2, and PX3 may also be arranged in a linear or island-like pattern.

The emission areas EA1, EA2, EA3, and EA4 of each of the pixels PX1, PX2, and PX3 may include a first emission area EA1, a second emission area EA2, a third emission area EA3, and a fourth emission area EA4 that emit light of different colors. Unlike the first emission area EA1 and the second emission area EA2, the third emission area EA3 and the fourth emission area EA4 may emit light having the same color. The first to fourth emission areas EA1, EA2, EA3, and EA4 may emit red, blue, or green light, respectively, and the color of the light emitted from each of the emission areas EA1, EA2, EA3, and EA4 may be different depending on the type of a light emitting element ED in FIG. 10 disposed on a light emitting element layer EML to be described later. In an embodiment, the first emission area EA1 may emit a first light of a red color, the second emission area EA2 may emit a second light of a blue color, and the third emission area EA3 and the fourth emission area EA4 may emit a third light of a green color. However, the disclosure is not limited thereto.

The plurality of emission areas EA1, EA2, EA3, and EA4 may be disposed in a Pentile™ type, for example, a diamond Pentile™ type. For example, in each of the pixels PX1, PX2, and PX3, the first emission area EA1 and the second emission area EA2 may be disposed to be spaced apart from each other in the first direction DR1, and the third emission area EA3 and the fourth emission area EA4 may be disposed to be spaced apart from each other in the second direction DR2. The first emission area EA1 may be disposed to be spaced apart from the third emission area EA3 in the fifth direction DR5, and may be disposed to be spaced apart from the fourth emission area EA4 in the fourth direction DR4. The second emission area EA2 may be disposed to be spaced apart from the third emission area EA3 in the fourth direction DR4, and may be disposed to be spaced apart from the fourth emission area EA4 in the fifth direction DR5.

In the plurality of pixels PX1, PX2, and PX3, the plurality of first to fourth emission areas EA1, EA2, EA3, and EA4 may be alternately disposed in the fourth direction DR4 or the fifth direction DR5. For example, the plurality of emission areas EA1, EA2, EA3, and EA4 may be disposed in rows R1, R2, R3, and R4 arranged along the fourth direction DR4 and columns C1, C2, C3, and C4 arranged along the fifth direction DR5. In the first row R1 and the third row R3, the second emission area EA2 and the third emission area EA3 may be alternately disposed along the fourth direction DR4. In the second row R2 and the fourth row R4, the first emission area EA1 and the fourth emission area EA4 may be alternately disposed along the fourth direction DR4. In the first column C1 and the third column C3, the second emission area EA2 and the fourth emission area EA4 may be alternately disposed along the fifth direction DR5. In the second column C2 and the fourth column C4, the first emission area EA1 and the third emission area EA3 may be alternately disposed along the fourth direction DR4.

Alternatively, the plurality of emission areas EA1, EA2, EA3, and EA4 may be arranged along the first direction DR1 or the second direction DR2. The first emission area EA1 and the second emission area EA2 may be alternately disposed along the first direction DR1 and the second direction DR2. The third emission area EA3 and the fourth emission area EA4 may be alternately disposed along the first direction DR1 and the second direction DR2.

Each of the first to fourth emission areas EA1, EA2, EA3, and EA4 may be defined by a plurality of openings OPE1, OPE2, OPE3 and OPE4 formed in a pixel defining layer PDL (see FIG. 10) of the light emitting element layer EML to be described later. For example, the first emission area EA1 may be defined by the first opening OPE1 of the pixel defining layer, the second emission area EA2 may be defined by the second opening OPE2 of the pixel defining layer, the third emission area EA3 may be defined by the third opening OPE3 of the pixel defining layer, and the fourth emission area EA4 may be defined by the fourth opening OPE4 of the pixel defining layer.

In an embodiment, the areas or sizes of the first to fourth emission areas EA1, EA2, EA3, and EA4 may be different from each other. In the embodiment of FIG. 8, the area of the second emission area EA2 may be greater than the areas of the first emission area EA1, the third emission area EA3, and the fourth emission area EA4, and the area of the first emission area EA1 may be greater than the areas of the third emission area EA3 and the fourth emission area EA4. The areas of the emission areas EA1, EA2, EA3, and EA4 may vary according to the sizes of the openings OPE1, OPE2, OPE3, and OPE4 formed in the pixel defining layer. The intensity of light emitted from the corresponding emission areas EA1, EA2, EA3, and EA4 may vary according to the areas of the emission areas EA1, EA2, EA3, and EA4, and the areas of the emission areas EA1, EA2, EA3, and EA4 may be adjusted to control the color of the screen displayed on the display device 10 or the electronic device 1. In the embodiment of FIG. 8, the second emission area EA2 having the largest area is illustrated, but is not limited thereto. The areas of the emission areas EA1, EA2, EA3, and EA4 may be freely adjusted according to the color of the screen required by the display device 10 and the electronic device 1. In addition, the areas of the emission areas EA1, EA2, EA3, and EA4 may be related to light efficiency and the lifespan of the light emitting element ED, and may have a trade-off relation with the reflection by external light. The areas of the emission areas EA1, EA2, EA3, and EA4 may be adjusted in consideration of the above factors.

Each of the plurality of pixels PX1, PX2, and PX3 may include the first to fourth emission areas EA1, EA2, EA3, and EA4 disposed adjacent to each other to express a white gray scale. However, the disclosure is not limited thereto, and the combination of the emission areas EA1, EA2, EA3, and EA4 constituting one pixel group may be variously modified depending on the arrangement of the emission areas EA1, EA2, and EA3, the color of the light emitted from the emission areas EA1, EA2, EA3, and EA4, and the like.

The display device 10 may include the plurality of color filters CF1, CF2, CF3, and CF4 disposed on the emission areas EA1, EA2, EA3, and EA4. The plurality of color filters CF1, CF2, CF3, and CF4 may be disposed to correspond to the emission areas EA1, EA2, EA3, and EA4, respectively. For example, the color filters CF1, CF2, CF3, and CF4 may be disposed on a light blocking layer BM (see FIG. 10) including a plurality of holes OPT1, OPT2, OPT3, and OPT4 disposed to correspond to the emission areas EA1, EA2, EA3, and EA4 or the openings OPE1, OPE2, OPE3, and OPE4. The holes OPT1, OPT2, OPT3, and OPT4 of the light blocking layer may be formed to overlap the openings OPE1, OPE2, OPE3, and OPE4, and may form a light exit area from which the light emitted from the emission areas EA1, EA2, EA3, and EA4 is emitted. Each of the color filters CF1, CF2, CF3, and CF4 may have a larger area than the holes OPT1, OPT2, OPT3, and OPT4 of the light blocking layer and the openings OPE1, OPE2, OPE3, and OPE4, and each of the color filters CF1, CF2, CF3, and CF4 may completely cover the light exit area formed by the holes OPT1, OPT2, OPT3, and OPT4.

The color filters CF1, CF2, CF3, and CF4 may include a first color filter CF1, a second color filter CF2, a third color filter CF3, and a fourth color filter CF4 disposed to correspond to the different emission areas EA1, EA2, EA3, and EA4, respectively. The color filters CF1, CF2, CF3, and CF4 may include a colorant such as a dye or a pigment that absorbs light in a wavelength band other than light in a specific wavelength band, and may be disposed to correspond to the color of the light emitted from the emission areas EA1, EA2, EA3, and EA4. For example, the first color filter CF1 may be a red color filter that is disposed to overlap the first emission area EA1 and transmits only the first light of the red color. The second color filter CF2 may be a blue color filter that is disposed to overlap the second emission area EA2 and transmits only the second light of blue color, the third color filter CF3 may be a green color filter that is disposed to overlap the third emission area EA3 and transmits only the third light of green color, and the fourth color filter CF4 may be a green color filter that is disposed to overlap the fourth emission area EA4 and transmits only the third light of green color.

Similarly to the disposition of the emission areas EA1, EA2, EA3, and EA4, the color filters CF1, CF2, CF3, and CF4 may be disposed in a Pentile™ type, for example, a diamond Pentile™ type. For example, in the plurality of pixels PX1, PX2, and PX3, the plurality of first to fourth color filters CF1, CF2, CF3, and CF4 may be alternately disposed in the fourth direction DR4 or the fifth direction DR5. For example, the plurality of color filters CF1, CF2, CF3, and CF4 may be disposed in the rows R1, R2, R3, and R4 arranged along the fourth direction DR4 and in the columns C1, C2, C3, and C4 arranged along the fifth direction DR5. In the first row R1 and the third row R3, the second color filter CF2 and the third color filter CF3 may be alternately disposed along the fourth direction DR4. In the second row R2 and the fourth row R4, the first color filter CF1 and the fourth color filter CF4 may be alternately disposed along the fourth direction DR4. In the first column C1 and the third column C3, the second color filter CF2 and the fourth color filter CF4 may be alternately disposed along the fifth direction DR5. In the second column C2 and the fourth column C4, the first color filter CF1 and the third color filter CF3 may be alternately disposed along the fourth direction DR4.

According to one embodiment, the plurality of color filters CF1, CF2, CF3, and CF4 may be disposed to partially overlap other adjacent color filters CF1, CF2, CF3, and CF4. FIG. 9 illustrates that the color filters CF1, CF2, CF3, and CF4 adjacent to each other are disposed to abut each other, but as will be described later, the adjacent color filters CF1, CF2, CF3, and CF4 may partially overlap at the boundary in which the adjacent color filters CF1, CF2, CF3, and CF4 abut each other. FIG. 9 illustrates the disposition of the color filters CF1, CF2, CF3, and CF4 as viewed from above, and it may be understood that among the color filters CF1, CF2, CF3, and CF4 overlapping each other, the edges of the color filters CF1, CF2, CF3, and CF4 disposed below are covered by the color filters CF1, CF2, CF3, and CF4 disposed above the edges. The different color filters CF1, CF2, CF3, and CF4 are areas that do not overlap the emission areas EA1, EA2, EA3, and EA4, and may overlap each other on the light blocking layer BM to be described later.

In the display device 10, the color filters CF1, CF2, CF3, and CF4 are disposed to overlap each other, so that the intensity of the reflected light by external light may be reduced. Furthermore, the color of the reflected light by the external light may be controlled by adjusting the disposition, shape, and area of the color filters CF1, CF2, CF3, and CF4 in plan view.

A touch electrode TL may be disposed between the emission areas EA1, EA2, EA3, and EA4. The touch electrode TL may be disposed to extend in the fourth direction DR4 and the fifth direction DR5, and may be spaced apart the emission areas EA1, EA2, EA3, and EA4 from without overlapping them. The touch electrode TL may be disposed to overlap the pixel defining layer PDL in FIG. 10 including the openings OPE1, OPE2, OPE3, and OPE4, and the light blocking layer BM (see FIG. 10) including the plurality of holes OPT1, OPT2, OPT3, and OPT4 to be described later. Although the touch electrode TL is briefly illustrated in FIG. 8, the touch electrode TL may be either the touch driving electrode TE or the sensing electrode RE of FIG. 7.

Meanwhile, as will be described later, the diameters of the openings OPE1, OPE2, OPE3, and OPE4 forming the emission areas EA1, EA2, EA3, and EA4 may be smaller than the diameters of the holes OPT1, OPT2, OPT3, and OPT4 of the light blocking layer BM. An opening interval between the openings OPE1, OPE2, OPE3, and OPE4 and the holes OPT1, OPT2, OPT3, and OPT4 of the light blocking layer BM may be defined for each of the emission areas EA1, EA2, EA3, and EA4. The opening interval may also be defined as a difference in diameter between the openings OPE1, OPE2, OPE3, and OPE4 of the pixel defining layer PDL and the holes OPT1, OPT2, OPT3, and OPT4 of the light blocking layer BM. In the display device 10, the same emission areas EA1, EA2, EA3, and EA4 belonging to the different pixels PX1, PX2, and PX3 may have different opening intervals between the openings OPE1, OPE2, OPE3, and OPE4 and the holes OPT1, OPT2, OPT3, and OPT4 of the light blocking layer BM. In the first pixel PX1, the second pixel PX2, and the third pixel PX3, the emission areas EA1, EA2, EA3, and EA4 may emit light of the same color, but in each thereof, the opening intervals between the openings OPE1, OPE2, OPE3, and OPE4 and the holes OPT1, OPT2, OPT3, and OPT4 of the light blocking layer BM may be different.

For example, each of the first to third pixels PX1, PX2, and PX3 may include the first emission area EA1 for emitting red light, but in each of the pixels PX1, PX2, and PX3, the opening intervals of the first emission areas EA1 may be different from each other. Similarly, in the first to third pixels PX1, PX2, and PX3, the second to fourth emission areas EA2, EA3, and EA4 may also emit light of the same color, but may have opening intervals different from each other. In addition, also in each of the pixels PX1, PX2, and PX3, the first to fourth emission areas EA1, EA2, EA3, and EA4 may have opening intervals different from each other.

In the display device 10, the specific emission areas EA1, EA2, EA3, and EA4 may have at least three among the emission areas EA1, EA2, EA3, and EA4 in which the opening intervals between the openings OPE1, OPE2, OPE3, and OPE4 and the holes OPT1, OPT2, OPT3, and OPT4 of the light blocking layer BM are different. The display device 10 may have three or more types of the homogeneous openings or the homogeneous emission areas having different opening intervals from each other. For example, in the first pixel PX1, the second pixel PX2, and the third pixel PX3, the opening intervals of the first emission areas EA1 may be different from each other. In the display area of the display device 10, three first emission areas EA1 having different opening intervals from each other may be disposed, and the three first emission areas EA1 may be disposed in the first pixel PX1, the second pixel PX2, and the third pixel PX3, respectively. This may be the same in the case of the second to fourth emission areas EA2, EA3, and EA4.

In addition, the display device 10 may include a pixel group PXG in which three first to third pixels PX1, PX2, and PX3 including the emission areas that are the same emission areas EA1, EA2, EA3, and EA4 but have different opening intervals are disposed in a specific arrangement. In the display area DA of the display device 10, a plurality of pixel groups PXG may be arranged in the first direction DR1 and the second direction DR2, or the fourth direction DR4 and the fifth direction DR5, and the first to third pixels PX1, PX2, and PX3 may be disposed in a specific arrangement in one pixel group PXG. The pixel group PXG in FIG. 9 may have a structure in which the second pixel PX2 and the third pixel PX3 are disposed in the fourth direction DR4 and the fifth direction DR5 with respect to the first pixel PX1 disposed at both ends of the first direction DR1. However, the arrangement of the different pixels PX1, PX2, and PX3 in the pixel group PXG is not limited thereto. The arrangement of the different pixels PX1, PX2, and PX3 may be related to the arrangement of the plurality of emission areas EA1, EA2, EA3, and EA4 having different opening intervals from each other. A detailed description thereof will be given later.

Figure 10:
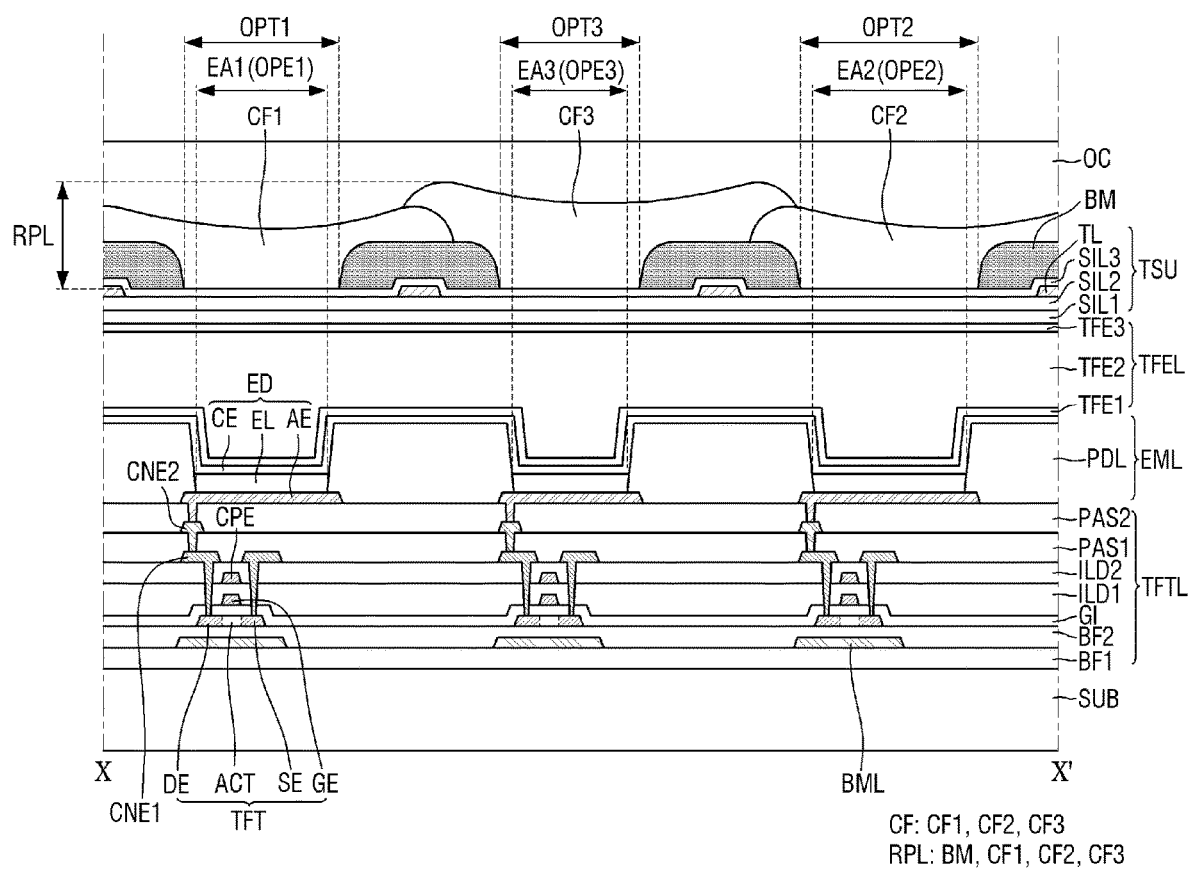
FIG. 10 is a cross-sectional view taken along line X-X' of FIG. 8.

FIG. 10 is a cross-sectional view taken along line X-X' of FIG. 8. FIG. 10 illustrates a cross section crossing the first emission area EA1, the third emission area EA3, and the second emission area EA2.

A cross-sectional structure of the display device 10 will be described with reference to FIG. 10 in addition to FIGS. 8 and 9. The display panel 100 of the display device 10 may include the display layer DU, the touch sensing layer TSU, and a reflection reduction layer RPL. The display layer DU may include the substrate SUB, the thin film transistor layer TFTL, the light emitting element layer EML, and the encapsulation layer TFEL. The display panel 100 may include the reflection reduction layer RPL disposed on the touch sensing layer TSU, and the reflection reduction layer RPL may include the light blocking layer BM and the color filter layer CFL.

The substrate SUB may be a base substrate or a base member. The substrate SUB may be a flexible substrate which can be bent, folded or rolled. For example, the substrate SUB may include a polymer resin such as polyimide (PI), but is not limited thereto. For another example, the substrate SUB may include a glass material or a metal material.

The thin film transistor layer TFTL may include a first buffer layer BF1, a lower metal layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing penetration of air or moisture. For example, the first buffer layer BF1 may include a plurality of inorganic layers alternately stacked.

The lower metal layer BML may be disposed on the first buffer layer BF1. For example, the lower metal layer BML may be formed as a single layer or multiple layers made of any one of molybdenum (Mo), aluminum (Al), chromium (Cr), gold (Au), titanium (Ti), nickel (Ni), neodymium (Nd), tantalum (Ta), and copper (Cu) or an alloy thereof.

The second buffer layer BF2 may cover the first buffer layer BF1 and the lower metal layer BML. The second buffer layer BF2 may include an inorganic layer capable of preventing penetration of air or moisture. For example, the second buffer layer BF2 may include a plurality of inorganic layers alternately stacked.

The thin film transistor TFT may be disposed on the second buffer layer BF2, and may constitute a pixel circuit of each of a plurality of pixels. For example, the thin film transistor TFT may be a switching transistor or a driving transistor of the pixel circuit. The thin film transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in the thickness direction, and may be insulated from the gate electrode GE by the gate insulating layer GI. In a part of the semiconductor layer ACT, a material of the semiconductor layer ACT may be made into a conductor to form the source electrode SE and the drain electrode DE.

The gate electrode GE may be disposed on the gate insulating layer GI. The gate electrode GE may overlap the semiconductor layer ACT with the gate insulating layer GI interposed therebetween.

The gate insulating layer GI may be disposed on the semiconductor layer ACT. For example, the gate insulating layer GI may cover the semiconductor layer ACT and the second buffer layer BF to insulate the gate electrode GE from the semiconductor layer ACT. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT to the second connection electrode CNE2. The first connection electrode CNE1 may be inserted into a contact hole provided in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to a pixel electrode AE of the light emitting element ED. The second connection electrode CNE2 may be inserted into a contact hole formed in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrode AE of the light emitting element ED passes.

The light emitting element layer EML may be disposed on the thin film transistor layer TFTL. The light emitting element layer EML may include the light emitting element ED and a pixel defining layer PDL. The light emitting element ED may include the pixel electrode AE, a light emitting layer EL, and a common electrode CE.

The pixel electrode AE may be disposed on the second passivation layer PAS2. The pixel electrode AE may be disposed to overlap any one of the openings OPE1, OPE2, OPE3, and OPE4 of the pixel defining layer PDL. The pixel electrode AE may be electrically connected to the drain electrode DE of the thin film transistor TFT through the first and second connection electrodes CNE1 and CNE2.

The light emitting layer EL may be disposed on the pixel electrode AE. For example, the light emitting layer EL may be an organic light emitting layer made of an organic material, but is not limited thereto. In the case of employing the organic light emitting layer as the light emitting layer EL, the thin film transistor TFT applies a predetermined voltage to the pixel electrode AE of the light emitting element ED, and if the common electrode CE of the light emitting element ED receives a common voltage or a cathode voltage, the holes and electrons can move to the light emitting layer EL through the hole transport layer and the electron transport layer and combine to produce light to be emitted by the light emitting layer EL.

The common electrode CE may be arranged on the light emitting layer EL. For example, the common electrode CE may be made in the form of an electrode common to all of the pixels rather than specific to each of the pixels. The common electrode CE may be disposed on the light emitting layer EL in the first to fourth emission areas EA1, EA2, EA3, and EA4, and may be disposed on the pixel defining layer PDL in an area other than the first to fourth emission areas EA1, EA2, EA3, and EA4.

The common electrode CE may receive the common voltage or a low potential voltage. When the pixel electrode AE receives a voltage corresponding to a data voltage and the common electrode CE receives the low potential voltage, a potential difference is formed between the pixel electrode AE and the common electrode CE, so that the light emitting layer EL may emit light.

The pixel defining layer PDL may include the plurality of openings OPE1, OPE2, OPE3, and OPE4, and may be disposed on a part of the second passivation layer PAS2 and the pixel electrode AE. The pixel defining layer PDL may include the first opening OPE1, the second opening OPE2, and the third opening OPE3, and each of the openings OPE1, OPE2, OPE3, and OPE4 may expose a part of the pixel electrode AE. As described above, each of the openings OPE1, OPE2, OPE3, and OPE4 of the pixel defining layer PDL may define the first to fourth emission areas EA1, EA2, EA3, and EA4, and the areas or sizes of the openings OPE1, OPE2, OPE3, and OPE4 may be different. The pixel defining layer PDL may separate and insulate the pixel electrode AE of each of the plurality of light emitting elements ED. The pixel defining layer PDL may include a light absorbing material to prevent light reflection. For example, the pixel defining layer PDL may include a polyimide (PI)-based binder and a pigment in which red, green, and blue colors are mixed. Alternatively, the pixel defining layer PDL may include a cardo-based binder resin and a mixture of a lactam black pigment and a blue pigment. Alternatively, the pixel defining layer PDL may include carbon black.

The encapsulation layer TFEL may be disposed on the common electrode CE to cover the plurality of light emitting elements ED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign matters such as dust.

In an embodiment, the encapsulation layer TFEL may include a first encapsulation layer TFE1, a second encapsulation layer TFE2, and a third encapsulation layer TFE3. The first encapsulation layer TFE1 and the third encapsulation layer TFE3 may be inorganic encapsulation layers, and the second encapsulation layer TFE2 disposed between the first encapsulation layer TFE1 and the third encapsulation layer TFE3 may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. Examples of the polymer-based material may include acrylic resin, epoxy resin, polyimide, polyethylene and the like. For example, the organic encapsulation layer 320 may include an acrylic resin, for example, polymethyl methacrylate, polyacrylic acid, or the like. The second encapsulation layer TFE2 may be formed by curing a monomer or applying a polymer.

The touch sensing layer TSU may be disposed on the encapsulation layer TFEL. The touch sensing layer TSU may include a first touch insulating layer SIL1, a second touch insulating layer SIL2, the touch electrode TL, and a third touch insulating layer SIL3.

The first touch insulating layer SIL1 may be disposed on the encapsulation layer TFEL. The first touch insulating layer SIL1 may have an insulating and optical function. The first touch insulating layer SIL1 may include at least one inorganic layer or organic layer. Optionally, the first touch insulating layer SIL1 may be omitted.

The second touch insulating layer SIL2 may cover the first touch insulating layer SIL1. Although not illustrated in the drawings, a touch electrode of another layer may be further disposed on the first touch insulating layer SIL1, and the second touch insulating layer SIL2 may cover the touch electrode TL. The second touch insulating layer SIL2 may have an insulating and optical function. For example, the second touch insulating layer SIL2 may be an inorganic layer or organic layer containing at least one of a silicon nitride layer, a silicon oxynitride layer, a silicon oxide layer, a titanium oxide layer, or an aluminum oxide layer.

A part of the touch electrode TL may be disposed on the second touch insulating layer SIL2. Each of the touch electrodes TL may not overlap the first to fourth emission areas EA1, EA2, EA3, and EA4. Each of the touch electrodes TL may be formed of a single layer containing molybdenum (Mo), titanium (Ti), copper (Cu), tantalum (Ta), aluminum (Al), or indium tin oxide ("ITO"), or may be formed to have a stacked structure (Ti/Al/Ti) of aluminum and titanium, a stacked structure (ITO/Al/ITO) of aluminum and ITO, an Ag—Pd—Cu ("APC") alloy, or a stacked structure (ITO/APC/ITO) of APC alloy and ITO.

The third touch insulating layer SIL3 may cover the touch electrode TL and the second touch insulating layer SIL2. The third touch insulating layer SIL3 may have an insulating and optical function. The third touch insulating layer SIL3 may be made of the material exemplified in the second touch insulating layer SIL2.

The reflection reduction layer RPL may be disposed on the touch sensing layer TSU. The reflection reduction layer RPL may include the light blocking layer BM and the color filter layer CFL. The display device 10 according to one embodiment may include the reflection reduction layer RPL implemented with the light blocking layer BM and the color filter layer CFL, and a polarizing layer, which is attached by a separate bonding member, for example, a bonding member such as PSA and OCA on the display layer DU, may be omitted.

The light blocking layer BM may be disposed on the third touch insulating layer SIL3 of the touch sensing layer TSU. The light blocking layer BM may be disposed to cover the conductive line of the touch electrode TL, and may include the plurality of holes OPT1, OPT2, OPT3, and OPT4 disposed to overlap the emission areas EA1, EA2, EA3, and EA4. For example, the first hole OPT1 may be disposed to overlap the first emission area EA1 or the first opening OPE1. The second hole OPT2 may be disposed to overlap the second emission area EA2 or the second opening OPE2, and the third hole OPT3 may be disposed to overlap the third emission area EA3 or the third opening OPE3. Although not illustrated in the drawing, the fourth hole OPT4 may be disposed to overlap the fourth emission area EA4 or the fourth opening OPE4. The area or size of each of the holes OPT1, OPT2, and OPT3, and OPT4 may be larger than the area or size of the openings OPE1, OPE2, OPE3, and OPE4 of the pixel defining layer PDL. The holes OPT1, OPT2, OPT3, and OPT4 of the light blocking layer BM are formed to be larger than the openings OPE1, OPE2, OPE3, and OPE4 of the pixel defining layer PDL, so that the light emitted from the emission areas EA1, EA2, EA3, and EA4 may be visually recognized by the user not only from the front surface but also from the side surface of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, or aniline black, but they are not limited thereto. The light blocking layer BM may prevent visible light infiltration and color mixture between the first to fourth emission areas EA1, EA2, EA3, and EA4, which leads to the improvement of color reproducibility of the display device 10.

The color filters CF1, CF2, CF3, and CF4 of the color filter layer CFL may be disposed on the light blocking layer BM. The different color filters CF1, CF2, CF3, and CF4 may be disposed to correspond to the different emission areas EA1, EA2, EA3, and EA4 or openings OPE1, OPE2, OPE3, and OPE4, and the holes OPT1, OPT2, OPT3, and OPT4 of the light blocking layer BM, respectively. For example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first hole OPT1 of the light blocking layer BM, the second color filter CF2 may be disposed in the second hole OPT2 of the light blocking layer BM, and the third color filter CF3 may be disposed in the third hole OPT3 of the light blocking layer BM. Although not illustrated in the drawing, the fourth color filter CF4 may be disposed in the fourth hole OPT4 of the light blocking layer BM to correspond to the fourth emission area EA4. Each of the color filters CF1, CF2, CF3, and CF4 may be disposed to have a larger area in plan view than the holes OPT1, OPT2, OPT3, and OPT4 of the light blocking layer BM, and some may be disposed directly on the light blocking layer BM.

The planarization layer OC may be disposed on the color filters CF1, CF2, CF3, and CF4 to planarize the upper ends of the color filters CF1, CF2, CF3, and CF4. The planarization layer OC may be a colorless light-transmitting layer that does not have a color in the visible light band. For example, the planarization layer OC may include a colorless light-transmitting organic material such as an acrylic resin.

According to one embodiment, the color filters CF1, CF2, CF3, and CF4 of the display device 10 may be disposed to overlap other color filters CF1, CF2, CF3, and CF4 adjacent to each other on the light blocking layer BM. The color filters CF1, CF2, CF3, and CF4 disposed on the light blocking layer BM may be disposed such that the two color filters CF1, CF2, CF3, and CF4 adjacent to each other completely cover the light blocking layer BM. The two adjacent color filters CF1, CF2, CF3, and CF4 may be disposed to partially overlap each other on the light blocking layer BM. The overlapping of the color filters CF1, CF2, CF3, and CF4 may reduce reflection of external light by the light blocking layer BM, and in order to further reduce the reflection of external light, the overlapping disposition of the color filters CF1, CF2, CF3 and CF4 may be designed.

For example, in the display device 10, the first color filter CF1 and the third color filter CF3 adjacent to each other may be disposed to overlap each other on the light blocking layer BM, and the second color filter CF2 and the third color filter CF3 may also be disposed to overlap each other on the light blocking layer BM. The first color filter CF1 and the fourth color filter CF4, and the second color filter CF2 and the fourth color filter CF4 adjacent to each other may also be disposed to overlap each other on the light blocking layer BM.

According to one embodiment, in the display device 10, the third color filter CF3 and the fourth color filter CF4 that are green color filters may be disposed above the first color filter CF1 that is a red color filter and the second color filter CF2 that is a blue color filter. The second color filter CF2 that is a blue color filter may be disposed above the first color filter CF1 that is a red color filter. In the manufacturing process of the display device 10, the color filters CF1, CF2, CF3, and CF4 may be formed using a photoresist process, and the process sequence for forming the color filters CF1, CF2, CF3, and CF4 may be performed in the order of the first color filter CF1, the second color filter CF2, and the third color filter CF3 and the fourth color filter CF4.

Although the light blocking layer BM may include a material that absorbs light, some of the light incident from the outside may also be reflected by the light blocking layer BM. A portion of the color filters CF1, CF2, CF3, and CF4 disposed in the holes OPT1, OPT2, OPT3, and OPT4 of the light blocking layer BM may be disposed directly on the light blocking layer BM and may be disposed to completely cover the light blocking layer BM. The two adjacent color filters CF1, CF2, CF3, and CF4 include different colorants and are disposed to overlap each other on the light blocking layer BM, so that the reflection of external light by the light blocking layer BM may be reduced. However, the light transmittance of the color filters CF1, CF2, CF3, and CF4 may vary according to the material forming the color filters CF1, CF2, CF3, and CF4, and the reflection due to external light may also be more effectively reduced according to the overlapping order of the color filters CF1, CF2, CF3, and CF4.

In an embodiment, each of the light transmittances of the third color filter CF3 and the fourth color filter CF4 that are green color filters may be smaller than each of the light transmittances of the first color filter CF1 and the second color filter CF2, and the third color filter CF3 and the fourth color filter CF4 may be disposed above other color filters (e.g., the first color filter CF1 and the second color filter CF2) on the light blocking layer BM. A light transmittance of the second color filter CF2 that is a blue color filter may be less than a light transmittance of the first color filter CF1 that is a red color filter, and the second color filter CF2 may be disposed on the first color filter CF1. When the color filters CF1, CF2, CF3, and CF4 having a relatively low light transmittance are disposed above the other color filters CF1, CF2, CF3, and CF4, it is possible to reduce the scattered reflection of light from the light blocking layer BM in a portion in which the different color filters CF1, CF2, CF3, and CF4 overlap each other. Accordingly, the light reflected from the light blocking layer BM may be prevented from being emitted to the outside, and the display device 10 may reduce reflection of external light occurring in areas other than the emission areas EA1, EA2, EA3, and EA4.

The reflection by the external light of the display device 10 may include reflection in the emission areas EA1, EA2, EA3, and EA4, reflection in the light transmitting area formed by the holes OPT1, OPT2, OPT3, and OPT4 of the light blocking layer BM, and reflection in the light blocking layer BM. When the sizes of the openings OPE1, OPE2, OPE3, and OPE4 of the pixel defining layer PDL, the sizes of the holes OPT1, OPT2, OPT3, and OPT4 of the light blocking layer BM, the intervals between the openings OPE1, OPE2, OPE3, and OPE4 and the holes OPT1, OPT2, OPT3, and OPT4, and the like are adjusted, it is possible to control the reflection of external light in the emission areas EA1, EA2, EA3, and EA4 and the light transmitting area. However, when the above conditions are controlled, factors related to the light efficiency of the display device 10 such as the efficiency and lifespan of the light emitting element ED and side visibility of the display device 10, and performance such as touch sensitivity of the touch sensing layer TSU may also be affected.

When the color filters CF1, CF2, CF3, and CF4 are disposed to be overlapped on the light blocking layer BM, the reflection of external light by the light blocking layer BM may be greatly reduced without affecting the light efficiency of the display device 10 described above. In addition, by adjusting the area and thickness of the color filters CF1, CF2, CF3, and CF4 in plan view, the overlapping portion width of the different color filters CF1, CF2, CF3, and CF4, and the like, the color of the reflected light may be controlled to a color that gives convenience to the user. For example, as the reflected light by external light, the color of the reflected light in the emission areas EA1, EA2, EA3, and EA4 and the light transmitting area may be controlled according to the area of the color filters CF1, CF2, CF3, and CF4, and the reflected light in the light blocking layer BM may vary depending on the area, width, and the like of the overlapping portion of the color filters CF1, CF2, CF3, and CF4.

In addition, according to one embodiment, the display device 10 may be designed such that the intervals between the emission areas EA1, EA2, EA3, and EA4 or the openings OPE1, OPE2, OPE3, and OPE4 of the pixel defining layer PDL and the holes OPT1, OPT2, OPT3, and OPT4 of the light blocking layer BM reduce reflected light due to external light or allow a diffraction pattern due to the reflected light to be visually recognized as white. Light incident on the display device 10 from the outside and reflected is reflected according to the intervals between the openings OPE1, OPE2, OPE3, and OPE4 of the pixel defining layer PDL and the holes OPT1, OPT2, OPT3, and OPT4 of the light blocking layer BM, so that the diffracted position thereof may be different, and accordingly, the light may be visually recognized as a stain having a specific color from the outside.

In the display device 10, external light incident into the holes OPT1, OPT2, OPT3, and OPT4 of the light blocking layer BM may be reflected by a material having a high reflectance such as the pixel electrode AE and the common electrode CE thereunder. The common electrode CE may be disposed along the inclined side surface of the pixel defining layer PDL on the pixel defining layer PDL, and the ratio of reflection of external light by the common electrode CE disposed on the pixel defining layer PDL may be high. The pixel defining layer PDL includes the plurality of openings OPE1, OPE2, OPE3, and OPE4 arranged to be spaced apart from each other at regular intervals, and while the reflected light is diffracted and interfered on each side of the different openings OPE1, OPE2, OPE3, and OPE4, the reflected light may be visually recognized as a stain of a specific diffraction pattern according to the arrangement of the openings OPE1, OPE2, OPE3, and OPE4.

The position at which lights reflected from the common electrode CE of the emission areas EA1, EA2, EA3, and EA4 are diffracted and interfere with each other may vary depending on the area or shape of the emission areas EA1, EA2, EA3, and EA4, and the reflected lights may have a specific color while passing through the color filters CF1, CF2, CF3, and CF4. The reflected lights reflected from the common electrode CE disposed in the emission areas EA1, EA2, EA3, and EA4 of the same color and emitted through the color filters CF1, CF2, CF3, and CF4 may interfere with each other and be visually recognized as a pattern of a specific color. The color of the diffraction pattern may also be controlled by adjusting the position at which the reflected lights having different colors are diffracted from each other.

The display device 10 may have a structure in which a diffraction pattern formed when the lights incident and reflected from the outside interfere with each other is reduced or the diffraction pattern is visually recognized as white. According to one embodiment, the display device 10 may be designed such that the intervals between the openings OPE1, OPE2, OPE3, and OPE4 of the pixel defining layer PDL or the emission areas EA1, EA2, EA3, and EA4 and the holes OPT1, OPT2, OPT3, and OPT4 of the light blocking layer BM reduce a diffraction pattern of reflected light. The areas of the openings OPE1, OPE2, OPE3, and OPE4 of the pixel defining layer PDL or the emission areas EA1, EA2, EA3, and EA4 may be different from each other, and at the same time, the intervals between the openings OPE1, OPE2, OPE3, and OPE4 of the pixel defining layer PDL and the holes OPT1, OPT2, OPT3, and OPT4 of the light blocking layer BM may also be different from each other. The interval ratio may also be related to the color of light emitted from the different emission areas EA1, EA2, EA3, and EA4, or the color of the color filters CF1, CF2, CF3, and CF4. Hereinafter, with reference to other drawings, the intervals between the openings OPE1, OPE2, OPE3, and OPE4 of the pixel defining layer PDL or the emission areas EA1, EA2, EA3, and EA4 and the holes OPT1, OPT2, OPT3, and OPT4 of the light blocking layer BM will be described.

Figure 11:
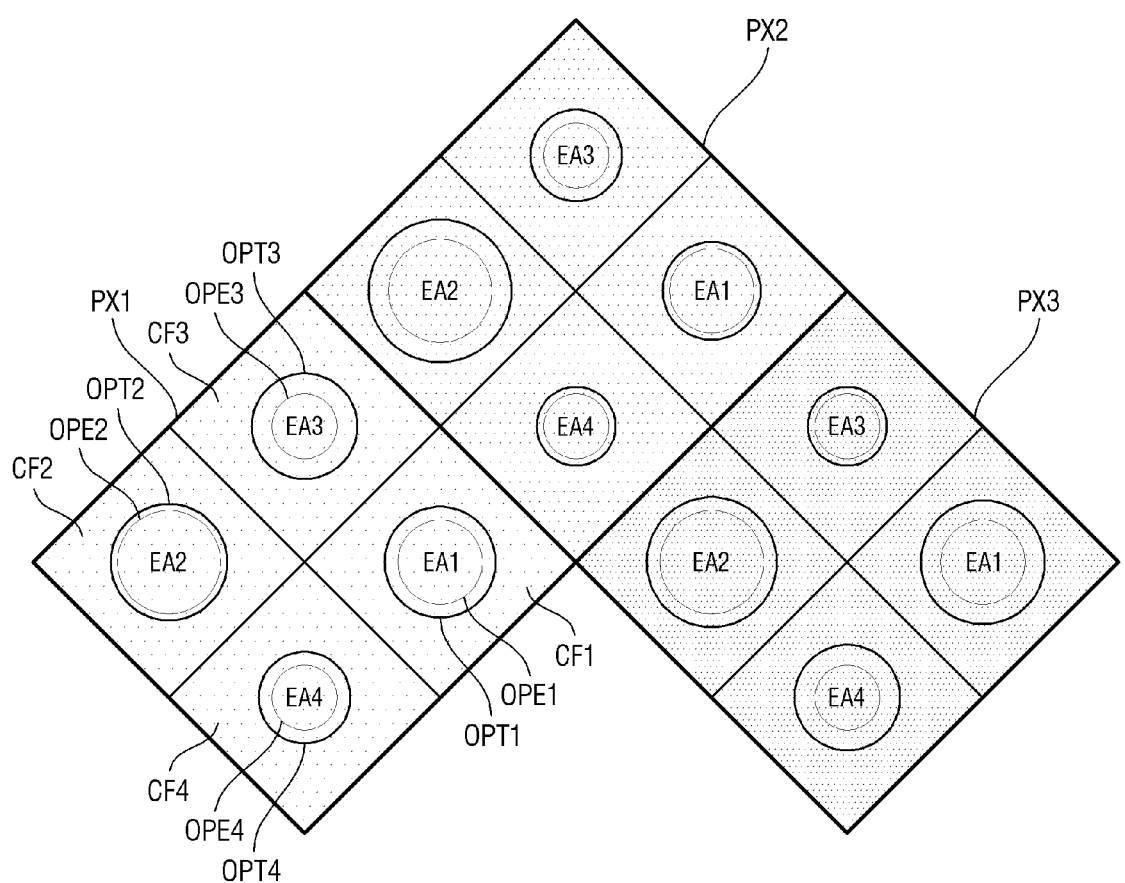
FIG. 11 is a plan view illustrating a disposition of emission areas of a first pixel, a second pixel, and a third pixel in a first display area of a display device according to one embodiment.
Figure 12:
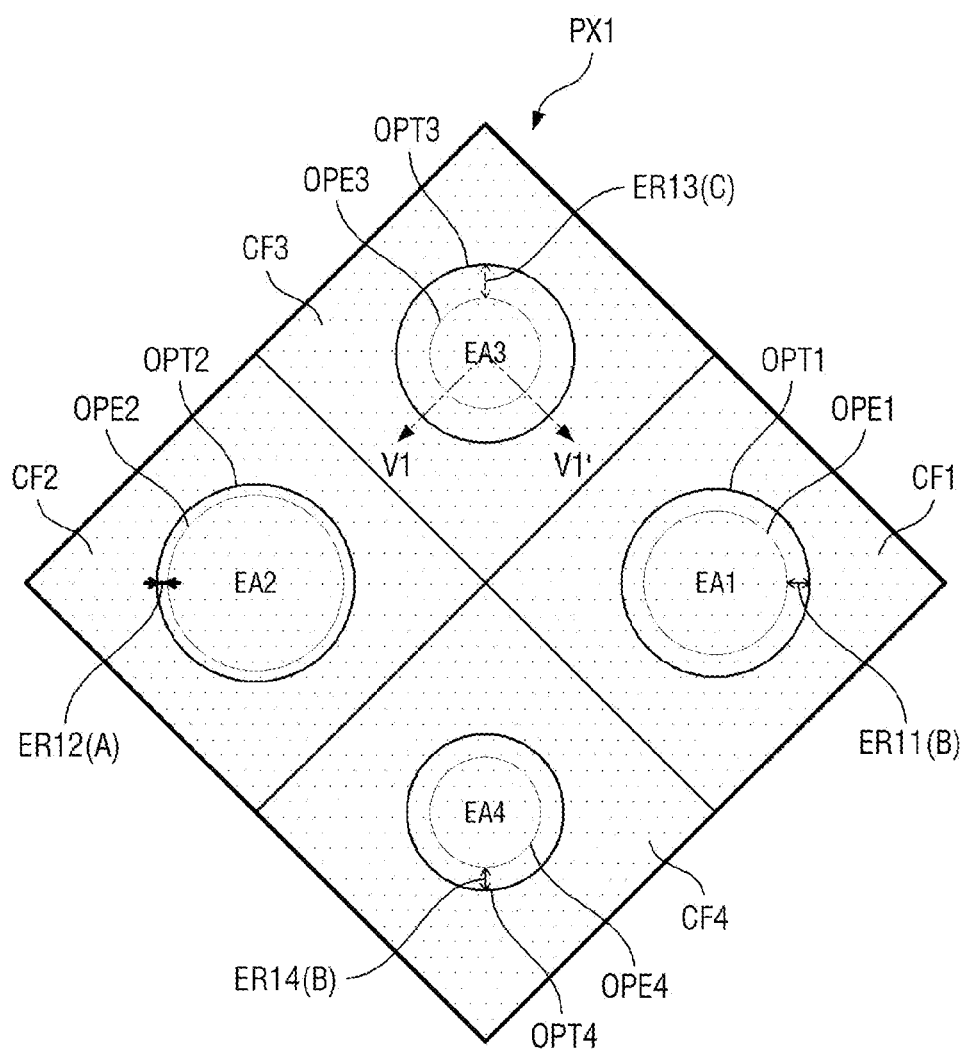
FIG. 12 is a plan view illustrating the first pixel of FIG. 11 in more detail.
Figure 13:
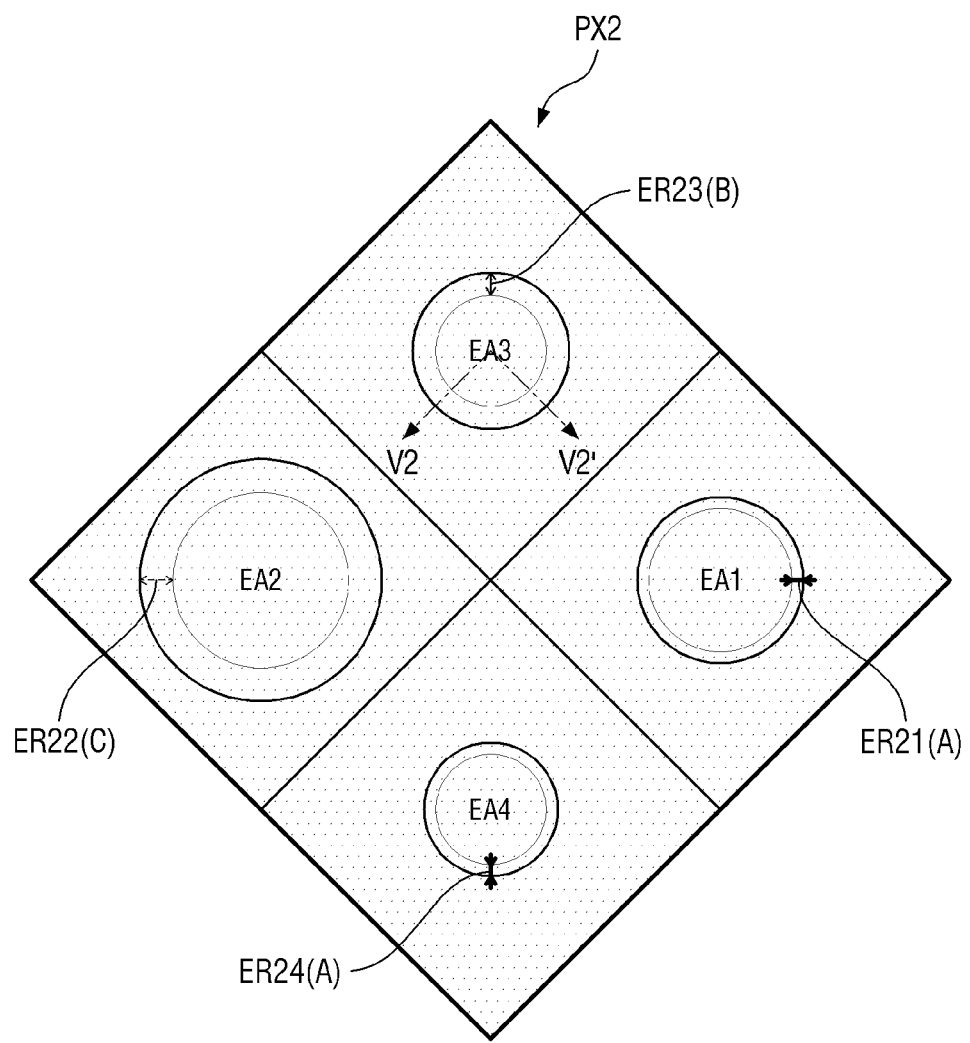
FIG. 13 is a plan view illustrating the second pixel of FIG. 11 in more detail.
Figure 14:
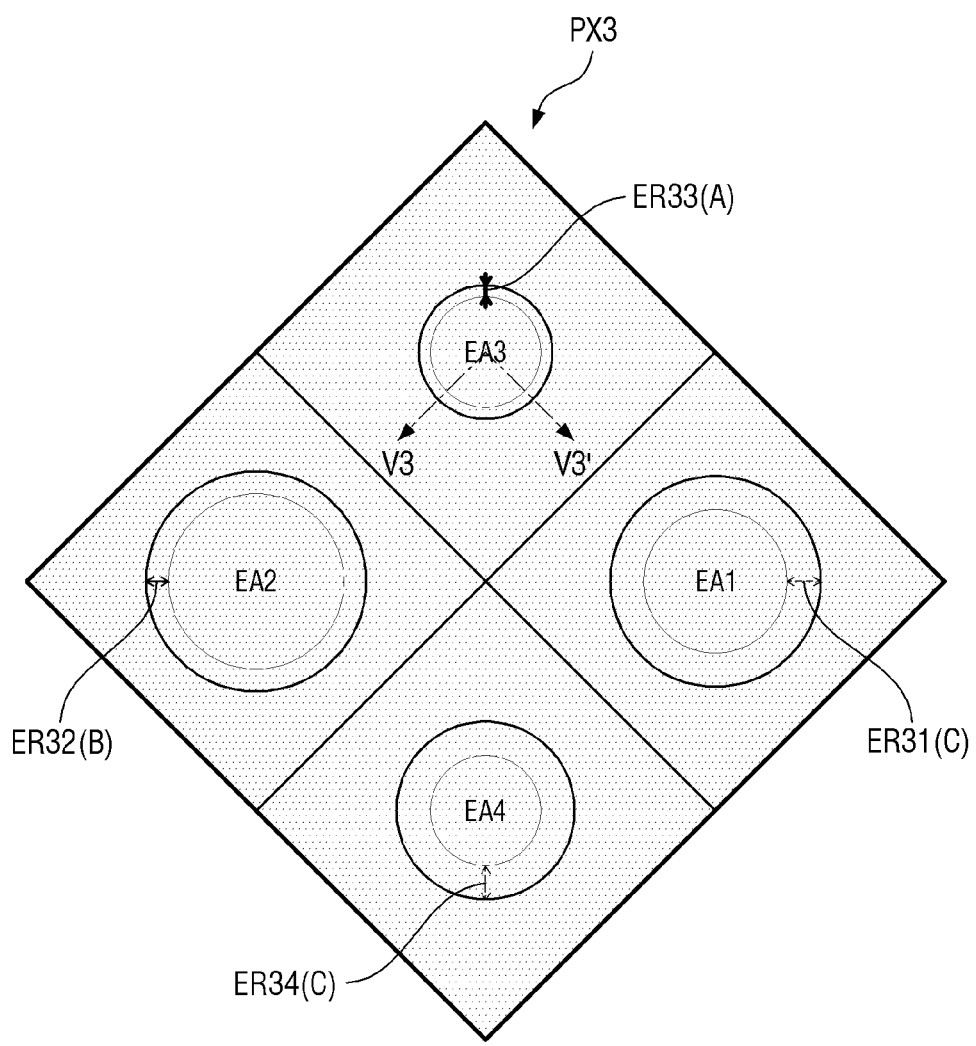
FIG. 14 is a plan view illustrating the third pixel of FIG. 11 in more detail.

FIG. 11 is a plan view illustrating a disposition of emission areas of a first pixel, a second pixel, and a third pixel in a first display area of a display device according to one embodiment. FIG. 12 is a plan view illustrating the first pixel of FIG. 11 in more detail. FIG. 13 is a plan view illustrating the second pixel of FIG. 11 in more detail. FIG. 14 is a plan view illustrating the third pixel of FIG. 11 in more detail.

Referring to FIG. 9 and FIGS. 11 to 14, according to one embodiment, the display device 10 may include the plurality of pixels PX1, PX2, and PX3 including the first to fourth emission areas EA1, EA2, EA3, and EA4. In each of the emission areas EA1, EA2, EA3, and EA4, an opening interval ER between a corresponding opening OPE1, OPE2, OPE3, and OPE4 and a corresponding hole OPT1, OPT2, OPT3 and OPT4 in plan view may be defined. As described above, the different emission areas EA1, EA2, EA3, and EA4 or the openings OPE1, OPE2, OPE3, and OPE4 may have different diameters depending on the wavelength band of the emitted light from them. In addition, in the display device 10 according to one embodiment, the opening intervals ER of the different emission areas EA1, EA2, EA3, and EA4 may be different from each other.

For example, in the first pixel PX1, a first opening interval ER11(B) of the first emission area EA1 may be different from each of a second opening interval ER12(A) of the second emission area EA2 and a third opening interval ER13(C) of the third emission area EA3 in the first pixel PX1. However, the first opening interval ER11(B) of the first emission area EA1 in the first pixel PX1 may be the same as a fourth opening interval ER14(B) of the fourth emission area EA4 in the first pixel PX1. In the first pixel PX1, the opening intervals ER11(B) and ER14(B) of the first emission area EA1 and the fourth emission area EA4 may each be smaller than the third opening interval ER13(C) of the third emission area EA3, but may be greater than the second opening interval ER12(A) of the second emission area EA2. The third opening interval ER13(C) of the third emission area EA3 may be greater than the second opening interval ER12(A) of the second emission area EA2.

In the second pixel PX2, a first opening interval ER21(A) of the first emission area EA1 may be different from each of a second opening interval ER22(C) of the second emission area EA2 and a third opening interval ER23(B) of the third emission area EA3 in the second pixel PX2. However, in the second pixel PX2, the first opening interval ER21(A) of the first emission area EA1 may be the same as a fourth opening interval ER24(A) of the fourth emission area EA4 in the second pixel PX2. In the second pixel PX2, the opening intervals ER21(A) and ER24(A) of the first emission area EA1 and the fourth emission area EA4 may each be smaller than each of the second opening interval ER22(C) of the second emission area EA2 and the third opening interval ER23(B) of the third emission area EA3. The second opening interval ER22(C) of the second emission area EA2 may be greater than the third opening interval ER23(B) of the third emission area EA3.

In the third pixel PX3, a first opening interval ER31(C) of the first emission area EA1 may be different from each of a second opening interval ER32(B) of the second emission area EA2 and a third opening interval ER33(A) of the third emission area EA3 in the third pixel PX3. However, in the third pixel PX3, the first opening interval ER31(C) of the first emission area EA1 may be the same as a fourth opening interval ER34(C) of the fourth emission area EA4 in the third pixel PX3. In the third pixel PX3, the opening intervals ER31(C) and ER34(C) of the first emission area EA1 and the fourth emission area EA4 may each be greater than each of the second opening interval ER32(B) of the second emission area EA2 and the third opening interval ER33(A) of the third emission area EA3. The second opening interval ER32(B) of the second emission area EA2 may be greater than the third opening interval ER33(A) of the third emission area EA3.

In an embodiment, the plurality of first emission areas EA1, second emission areas EA2, and third emission areas EA3 and the fourth emission areas EA4 disposed in the display device 10 may be "homogeneous emission areas" that emit light of the same color as each other. In the pixel defining layer PDL, the plurality of first openings OPE1, second openings OPE2, third openings OPE3, and fourth openings OPE4 may be "homogeneous openings" in which the light emitting elements ED1, ED2, ED3, and ED4 for emitting light of the same color are disposed. In another embodiment, the emission areas EA1, EA2, EA3, and EA4 for emitting light of different colors may be referred as "heterogeneous emission areas," and the openings in which the light emitting elements ED1, ED2, ED3, and ED4 for emitting light of different colors are disposed may be referred as "heterogeneous openings." In the display device 10, the opening intervals among the homogeneous emission areas, or among the homogeneous openings may be different from each other, and the opening intervals among the heterogeneous emission areas or among the heterogeneous openings may also be different from each other or the same.

In each of the first to third pixels PX1, PX2, and PX3, the emission areas EA1, EA2, EA3, and EA4 for emitting light of different colors may be disposed with the various opening intervals ER. In an embodiment, in each of the pixels PX1, PX2, and PX3, the opening intervals ER of the emission areas EA1, EA2, EA3, and EA4 that emit light in a specific wavelength band may not always be the same, and in some cases, the opening intervals ER of the emission areas EA1, EA2, EA3, and EA4 that emit light of different colors may be the same. The opening intervals ER of the emission areas EA1, EA2, EA3, and EA4 above may be designed in consideration of the opening intervals ER of the different emission areas EA1, EA2, EA3, and EA4 that are adjacent while emitting the same light in the plurality of pixels PX1, PX2, and PX3.

In the display device 10, the emission areas EA1, EA2, EA3, and EA4 that emit light of the same color in the same row R1, R2, R3, R4 or the same column C1, C2, C3, C4 may be disposed to have different opening intervals from each other. For example, in FIGS. 9 and 11, in the first emission areas EA1 of the first pixel PX1, the second pixel PX2, and the third pixel PX3, the opening intervals ER11, ER21, and ER31 may be different from each other. Referring to FIG. 9, the plurality of first emission areas EA1 disposed in the second row R2 may belong to the first pixel PX1, the second pixel PX2, and the third pixel PX3, respectively, and the opening intervals thereof may be different from each other. Similarly, the plurality of third emission areas EA3 disposed in the first row R1 may belong to the first pixel PX1, the second pixel PX2, and the third pixel PX3, respectively, and the opening intervals thereof may be different from each other. The same may be applied to the third emission area EA3 and the fourth emission area EA4 disposed in the first row R1 or the second row R2. In the display device 10 according to one embodiment, the plurality of emission areas EA1, EA2, EA3, and EA4 for emitting light of the same color along a direction in which the emission areas EA1, EA2, EA3, and EA4 are arranged may have the different opening intervals ER from each other. In the emission areas EA1, EA2, EA3, and EA4 arranged along the specific rows R1, R2, R3, and R4, or the columns C1, C2, C3, and C4, the emission areas EA1, EA2, EA3, and EA4 with the different opening intervals ER may be at least three kinds.

As illustrated in FIGS. 11 to 14, the first emission area EA1 may be distinguished into three first emission areas EA1 having the different opening intervals ER11, ER21, and ER31. This may also be the case for the second emission area EA2, the third emission area EA3, and the fourth emission area EA4. The display device 10 may be distinguished into the emission areas EA1, EA2, EA3, and EA4 in which the emission areas EA1, EA2, EA3, and EA4 that emit light of the same color have the different opening intervals ER from each other, and the visual recognition of the diffraction pattern by external light may be reduced.

White light incident from the outside is a mixture of the lights of different wavelength bands from each other, and when the light is reflected and diffracted, the diffracted position thereof may be proportional to the wavelength of the light. For example, the reflected light having the same wavelength band as the blue light may be positioned closer to the center of the diffraction pattern than the reflected light having the same wavelength band as the green light or the red light. The reflected light having the same wavelength band as the green light may be positioned closer to the center of the diffraction pattern than the reflected light having the same wavelength band as the red light. In the diffraction pattern formed by the diffracted light reflected in the emission areas EA1, EA2, EA3, and EA4, patterns of blue light, green light, and red light may be positioned from the center toward the outside.

The diffracted position of the reflected light, and the phase of the diffracted light may vary according to the diameters of the emission areas EA1, EA2, EA3, and EA4 or the openings OPE1, OPE2, OPE3, and OPE4 and the holes OPT1, OPT2, OPT3, and OPT4, and the opening intervals therebetween. When the light of the same wavelength band is reflected, the position of the diffracted light may be different according to the size of the opening interval ER between the openings OPE1, OPE2, OPE3, and OPE4 and the holes OPT1, OPT2, OPT3, and OPT4. Using the above, the light reflected from the emission areas EA1, EA2, EA3, and EA4 having the different opening intervals ER from each other but for emitting light of the same color may cause interference because the phases of the diffracted light are different from each other, and the diffracted lights may interfere with each other and may not be visually recognized as a pattern. The display device 10 may include the plurality of emission areas EA1, EA2, EA3, and EA4, and the opening intervals ER among the emission areas EA1, EA2, EA3, and EA4 for emitting light of the same color may be designed to be different from each other, so that a diffraction pattern caused by light reflected from the emission areas EA1, EA2, EA3, and EA4 may be reduced.

In the first to third pixels PX1, PX2, and PX3 illustrated in FIGS. 11 to 14, the opening intervals ER11, ER21, and ER31 in three first emission areas EA1 may be different from each other. Diffracted light of light reflected from the first emission areas EA1 of the first to third pixels PX1, PX2, and PX3 may pass through the first color filter CF1 and be visually recognized as red. However, since the opening intervals ER of the different first emission areas EA1 are different from each other, some of the diffracted lights reflected from the first emission areas EA1 of the first to third pixels PX1, PX2, and PX3 may cause destructive interference with each other, and the intensity of diffracted light reflected from the different first emission areas EA1 may be weakened. In the same manner, in the first to third pixels PX1, PX2, and PX3 illustrated in FIGS. 11 to 14, the second to fourth emission areas EA2, EA3, and EA4 may include three emission areas having the opening intervals ER different from each other, and the diffracted lights reflected therefrom may be weakened in intensity. Accordingly, the display device 10 may prevent a diffraction pattern due to light reflected from the emission areas EA1, EA2, EA3, and EA4 from being visually recognized by a user, and may provide the user with a convenient feeling of use.

In the plurality of emission areas EA1, EA2, EA3, and EA4, the size of the opening interval ER and the deviation between the different opening intervals ER may be designed in various ways according to the color required for the display device 10. In an embodiment, the plurality of emission areas EA1, EA2, EA3, and EA4 may have three different opening intervals ER from each other, and regardless of the wavelength band of light emitted from the emission areas EA1, EA2, EA3, and EA4, the sizes of the three opening intervals ER may be the same. For example, in the first to third pixels PX1, PX2, and PX3, the emission area having the smallest opening interval may be the second emission area EA2 of the first pixel PX1, the first emission area EA1 and the fourth emission area EA4 of the second pixel PX2, and the third emission area EA3 of the third pixel PX3. The opening interval ER12(A) of the second emission area EA2 of the first pixel PX1 may be the same as the opening intervals ER21(A) and ER24(A) of the first emission area EA1 and the fourth emission area EA4 of the second pixel PX2, and may also be the same as the opening interval ER33(A) of the third emission area EA3 of the third pixel PX3. The smallest size of the opening interval of the above-described emission areas may be referred to as a "minimum opening interval A."

In the first to third pixels PX1, PX2, and PX3, the emission area having the largest opening interval may be the third emission area EA3 of the first pixel PX1, the second emission area EA2 of the second pixel PX2, and the first emission area EA1 and the fourth emission area EA4 of the third pixel PX3. The opening interval ER13(C) of the third emission area EA3 of the first pixel PX1 may be the same as the opening interval ER22(C) of the second emission area EA2 of the second pixel PX2, and may also be the same as the opening intervals ER31(C) and ER34(C) of the first emission area EA1 and the fourth emission area EA4 of the third pixel PX3. The largest size of the opening interval of the above-described emission areas may be referred to as a "maximum opening interval C."

In the first to third pixels PX1, PX2, and PX3, the emission area with an opening interval having an intermediate value may be the first emission area EA1 and the fourth emission area EA4 of the first pixel PX1, the third emission area EA3 of the second pixel PX2, and the second emission area EA2 of the third pixel PX3. The opening intervals ER11(B) and ER14(B) of the first emission area EA1 and the fourth emission area EA4 of the first pixel PX1 may be the same as the opening interval ER23(B) of the third emission area EA3 of the second pixel PX2, and may be the same as the opening interval ER32(B) of the second emission area EA2 of the third pixel PX3. An opening interval having an intermediate size of the above-described emission areas may be referred to as an "intermediate opening interval B."

In the display device 10, the diameters of the emission areas EA1, EA2, EA3, and EA4 for emitting light of different colors are different from each other, so that the holes OPT1, OPT2, OPT3, and OPT4 of the light blocking layer BM corresponding to the emission areas EA1, EA2, EA3, and EA4 having the same opening interval ER in the emission areas EA1, EA2, EA3, and EA4 may have different diameters from each other. For example, in the first pixel PX1, the first hole OPT1 and the fourth hole OPT4 corresponding to the first emission area EA1 and the fourth emission area EA4 having the same opening interval ER as each other may have different diameters from each other. Similarly, the opening interval ER11 of the first emission area EA1 of the first pixel PX1 may be the same as the opening interval ER23 of the third emission area EA3 of the second pixel PX2, and the first hole OPT1 of the first pixel PX1 may have a different diameter from the third hole OPT3 of the second pixel PX2. The above-described content may be applied to the other pixels PX1, PX2, and PX3, and the emission areas EA1, EA2, EA3, and EA4 in the same manner.

According to one embodiment, in the display device 10, a difference among the minimum opening interval, the intermediate opening interval, and the maximum opening interval of the emission areas EA1, EA2, EA3, and EA4 may be the same. For example, the difference between the minimum opening interval and the intermediate opening interval may be the same as the difference between the intermediate opening interval and the maximum opening interval. In the plurality of emission areas EA1, EA2, EA3, and EA4, a deviation of the opening interval ER may be independent of a wavelength band of light emitted from the emission areas EA1, EA2, EA3, and EA4.

In an embodiment, the display device 10 may have the opening interval of each of the emission areas EA1, EA2, EA3, and EA4, that is, the opening intervals ER between the openings OPE1, OPE2, OPE3, and OPE4 and the holes OPT1, OPT2, OPT3, and OPT4 in a range of about 3 micrometers (µm) to about 10 µm, and the deviations of the different opening intervals ER from each other may be in a range of about 0.5 µm to about 1 µm. The size of the opening interval ER may have a minimum size of about 3 µm or more in consideration of the process variation of the photo process for forming the pixel defining layer PDL and the light blocking layer BM. In addition, the opening interval ER may have a maximum size of about 10 µm in consideration of side visibility, color, and amount of reflected light of the display device 10. The deviation between the opening intervals ER may be designed to have a size large enough that diffracted lights due to external light may cause destructive interference with each other. In an embodiment, the deviations of the different opening intervals ER from each other may be about 0.5 µm, about 0.72 µm, or about 1 µm. In one embodiment in which the deviations of the different opening intervals ER from each other is about 0.5 µm, the minimum opening interval may be about 4.72 µm, the intermediate opening interval may be about 5.22 µm, and the maximum opening interval may be about 5.72 µm. However, the disclosure is not limited thereto.

The display device 10 may include emission areas EA1, EA2, EA3, and EA4 having at least three different opening intervals ER from each other. As described above, based on the same emission area EA1, EA2, EA3, EA4, the display device 10 may include emission areas having a minimum opening interval, an intermediate opening interval, and a maximum opening interval. However, it is not necessarily limited to having the three different opening intervals ER from each other, and in some cases, the emission areas EA1, EA2, EA3, and EA4 may be designed to have the four different opening intervals ER. In this case, one pixel group PXG may include a total of 16 pixels including four pixels in a repeating unit.

In the display device 10, the opening intervals between homogeneous openings or homogeneous emission areas may be different from each other. However, in an embodiment, in the display device 10, the opening intervals between heterogeneous openings or heterogeneous emission areas may be the same. FIGS. 11 to 14 illustrate that in the emission areas EA1, EA2, EA3, and EA4 for emitting light of the same color, the deviation of the opening intervals is the same, and in the emission areas EA1, EA2, EA3, and EA4 for emitting light of different colors, the opening interval is the same. The homogeneous openings or the homogeneous emission areas may include three openings or emission areas, in which the opening interval has a minimum opening interval, an intermediate opening interval, or a maximum opening interval. Opening intervals may be different among the homogeneous openings or the homogeneous emission areas, but a deviation among the opening intervals may be constant. The heterogeneous openings or the heterogeneous emission areas may include openings or emission areas having the same opening interval. In the heterogeneous openings or the heterogeneous emission areas, openings or emission areas having the same minimum opening interval, intermediate opening interval, or maximum opening interval may exist.

However, the disclosure is not limited thereto. In another embodiment, in the emission areas EA1, EA2, EA3, and EA4 for emitting light of the same color, the deviations of opening intervals may be different. For example, the difference between the minimum opening interval and the intermediate opening interval may be different from the difference between the intermediate opening interval and the maximum opening interval. In addition, in the emission areas EA1, EA2, EA3, and EA4 for emitting light of different colors, the opening interval may be different or the deviation of the opening interval may also be different. A description thereof will be given later with reference to other drawings.

Figure 15:
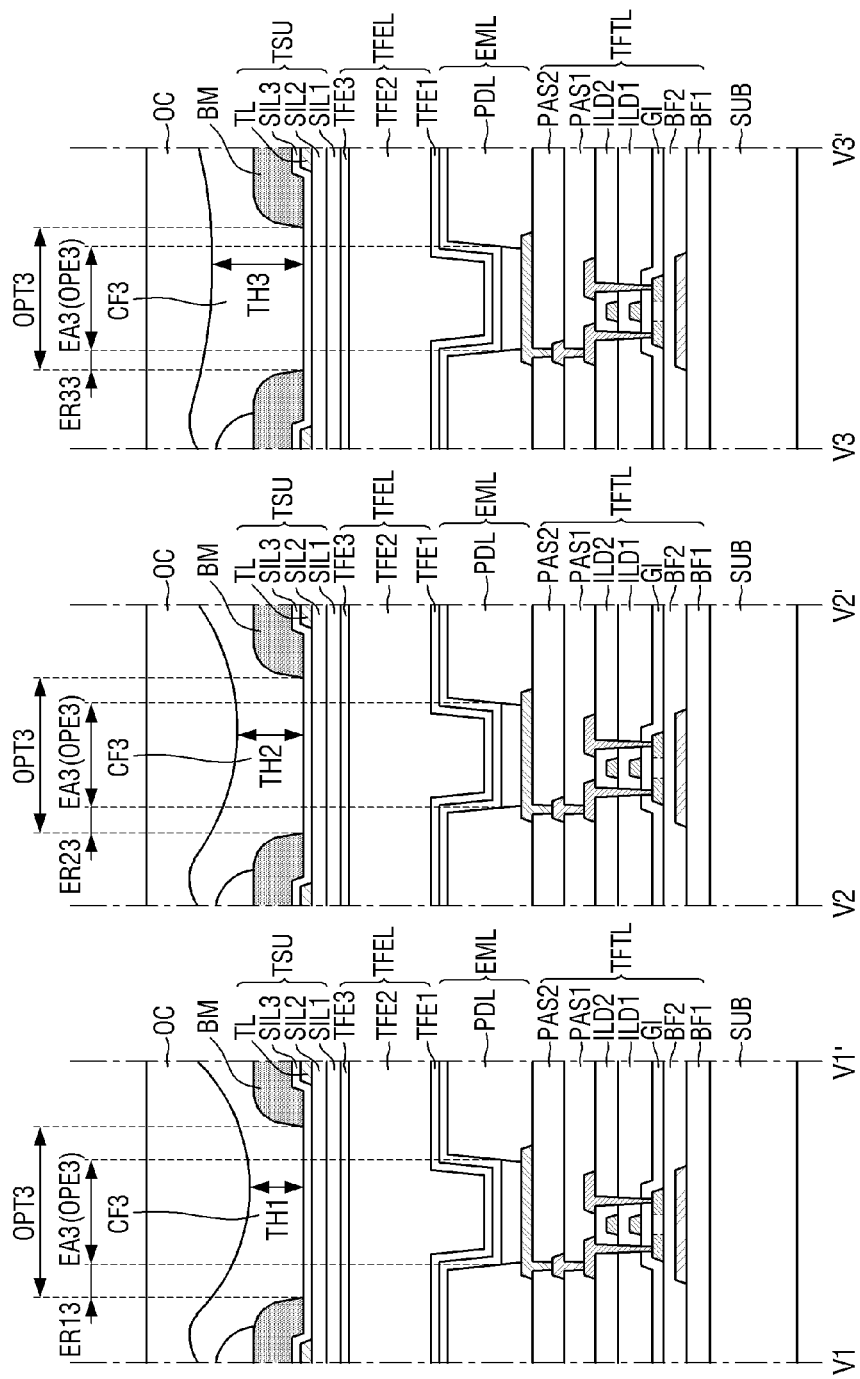
FIG. 15 is a cross-sectional view taken along line V1-V1' of FIG. 12, line V2-V2' of FIG. 13, and line V3-V3' of FIG. 14.

FIG. 15 is a cross-sectional view taken along line V1-V1' of FIG. 12, line V2-V2' of FIG. 13, and line V3-V3' of FIG. 14. FIG. 15 illustrates a cross section crossing the third emission area EA3 in the first pixel PX1, the second pixel PX2, and the third pixel PX3.

Referring to FIG. 15, in the display device 10 according to one embodiment, in the emission areas EA1, EA2, EA3, and EA4 for emitting light of the same color, the emission areas EA1, EA2, EA3, and EA4 having the different opening intervals ER from each other may have the different thicknesses of the color filters CF1, CF2, CF3, and CF4 from each other. For example, in the third emission area EA3 of the first pixel PX1, the opening interval ER13 may be the maximum opening interval, in the third emission area EA3 of the second pixel PX2, the opening interval ER23 may be the intermediate opening interval, and in the third emission area EA3 of the third pixel PX3, the opening interval ER33 may be the minimum opening interval. Although in each of the third emission areas EA3 for emitting the same green light, the third color filter CF3 may be disposed on the third hole OPT3, the opening intervals ER13, ER23, and ER33 may be different from each other in the third emission areas EA3 in the first pixel PX1, the second pixel PX2, and the third pixel PX3.

In the display device 10, the size of the opening interval ER and thicknesses TH1, TH2, and TH3 of the middle portions of the color filters CF1, CF2, CF3, and CF4 disposed on the corresponding holes OPT1, OPT2, OPT3 and OPT4 may have an inverse relationship with each other. Here, the middle portion of a color filter is a center portion of the color filter in a plan view. For example, in the third pixel PX3 in which the third emission area EA3 has a minimum opening interval, the third color filter CF3 disposed in the third hole OPT3 corresponding to the third emission area EA3 may have the thickness TH3 greater than each of the thicknesses TH1 and TH2 of the third color filters CF3 of the first pixel PX1 and the second pixel PX2. In the second pixel PX2 in which the third emission area EA3 has an intermediate opening interval, the third color filter CF3 disposed in the third hole OPT3 corresponding to the third emission area EA3 may have the thickness TH2 greater than the thickness TH1 of the third color filter CF3 of the first pixel PX1. As the opening intervals ER13, ER23, and ER33 increase, the diameter of the third hole OPT3 may increase, and accordingly, the thicknesses TH1, TH2, and TH3 of the third color filter CF3 may decrease. When the opening interval ER decreases and the thicknesses TH1, TH2, and TH3 of the color filters CF1, CF2, CF3, and CF4 increase, the light transmittance of the color filter may decrease, and accordingly, the intensity of reflected light may decrease.

The display device 10 according to one embodiment may induce destructive interference of diffracted light by adjusting the opening intervals ER of the emission areas EA1, EA2, EA3, and EA4, and at the same time may lower the light transmittance of reflected light by upwardly adjusting the thicknesses of the color filters CF1, CF2, CF3, and CF4. Accordingly, the display device 10 may effectively prevent the reflected light by external light from being visually recognized as a pattern, and may provide a more comfortable feeling of use. In this embodiment, a polarization layer is not disposed on the pixel defining layer PDL to keep the destructive interference above.

Hereinafter, other embodiments of the display device 10 will be described with reference to other drawings.

Figure 16:
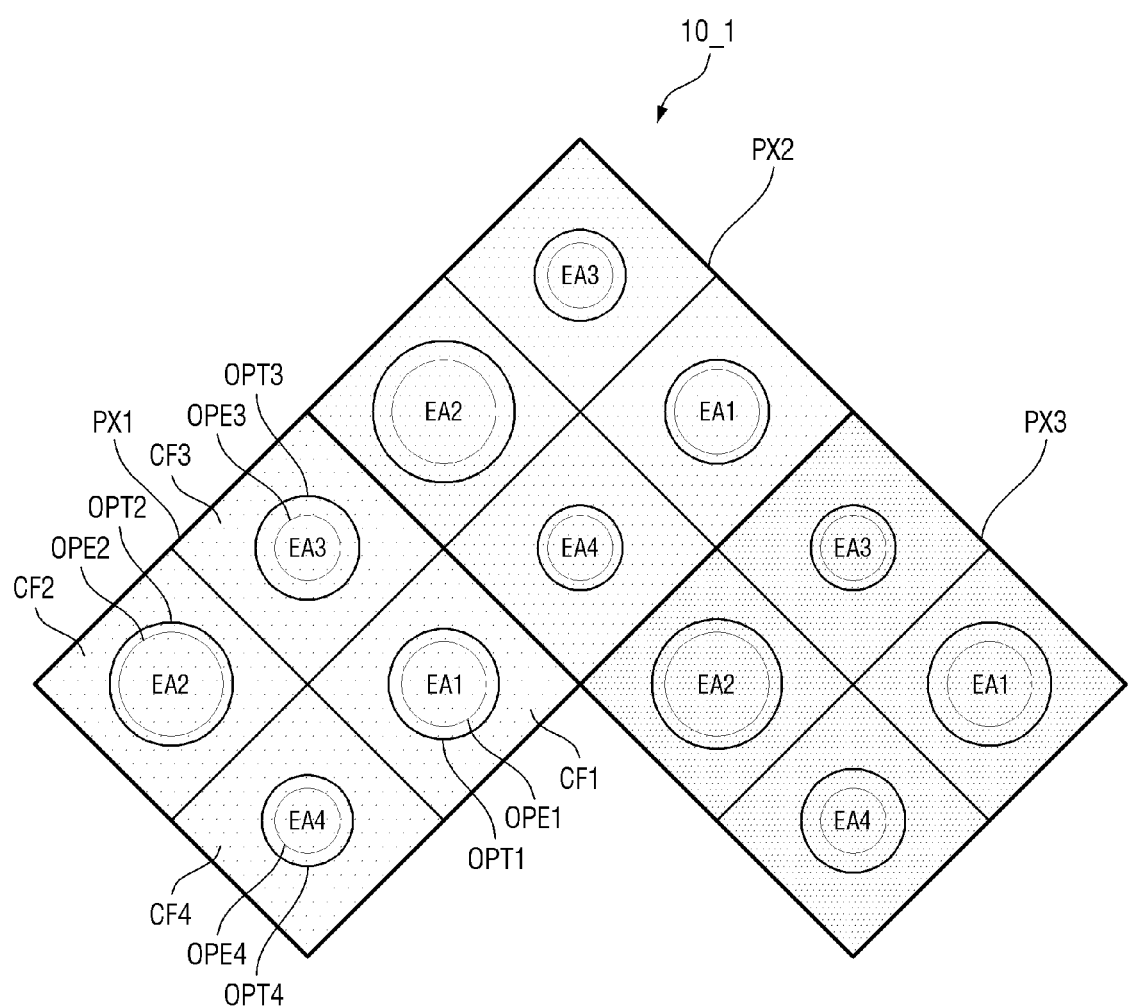
FIG. 16 is a plan view illustrating a disposition of emission areas of a first pixel, a second pixel, and a third pixel in a first display area of a display device according to another embodiment.
Figure 17:
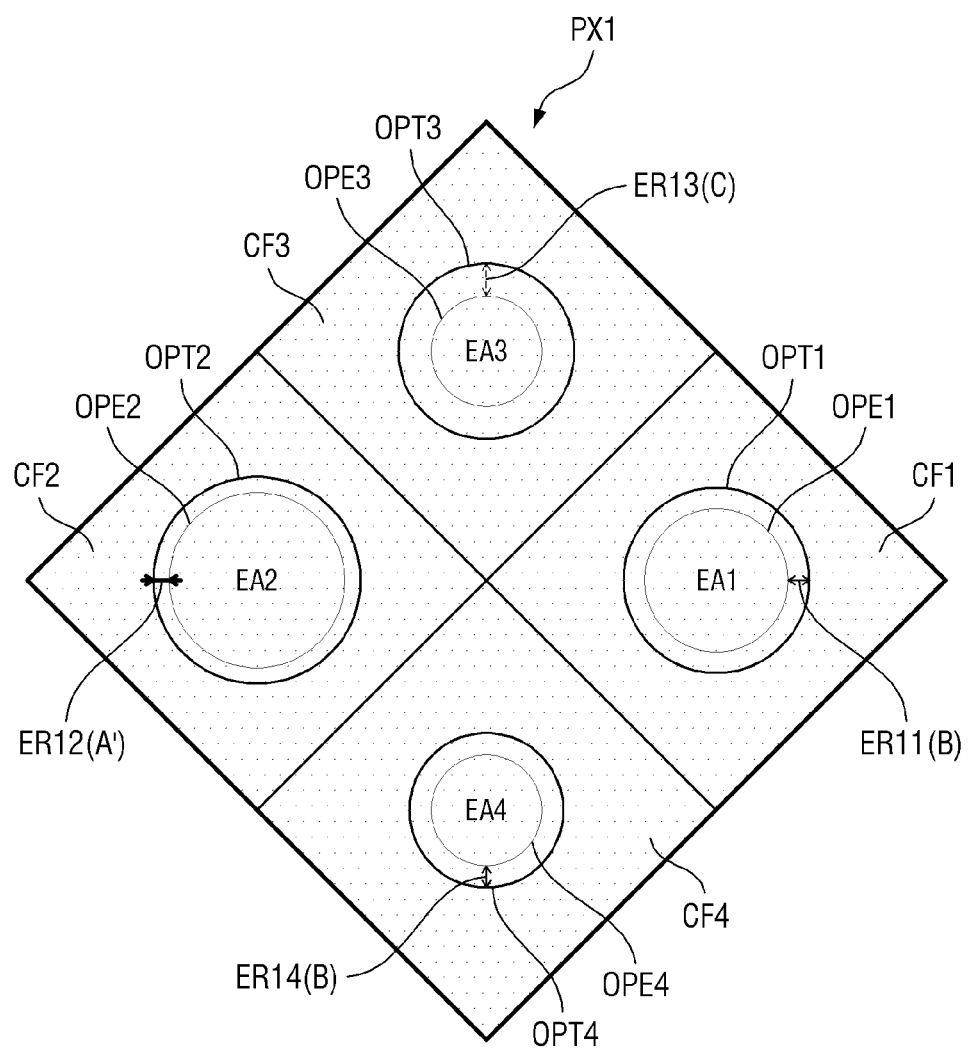
FIGS. 17 to 19 are plan views illustrating the first pixel, the second pixel, and the third pixel of FIG. 16 in more detail, respectively.
Figure 18:
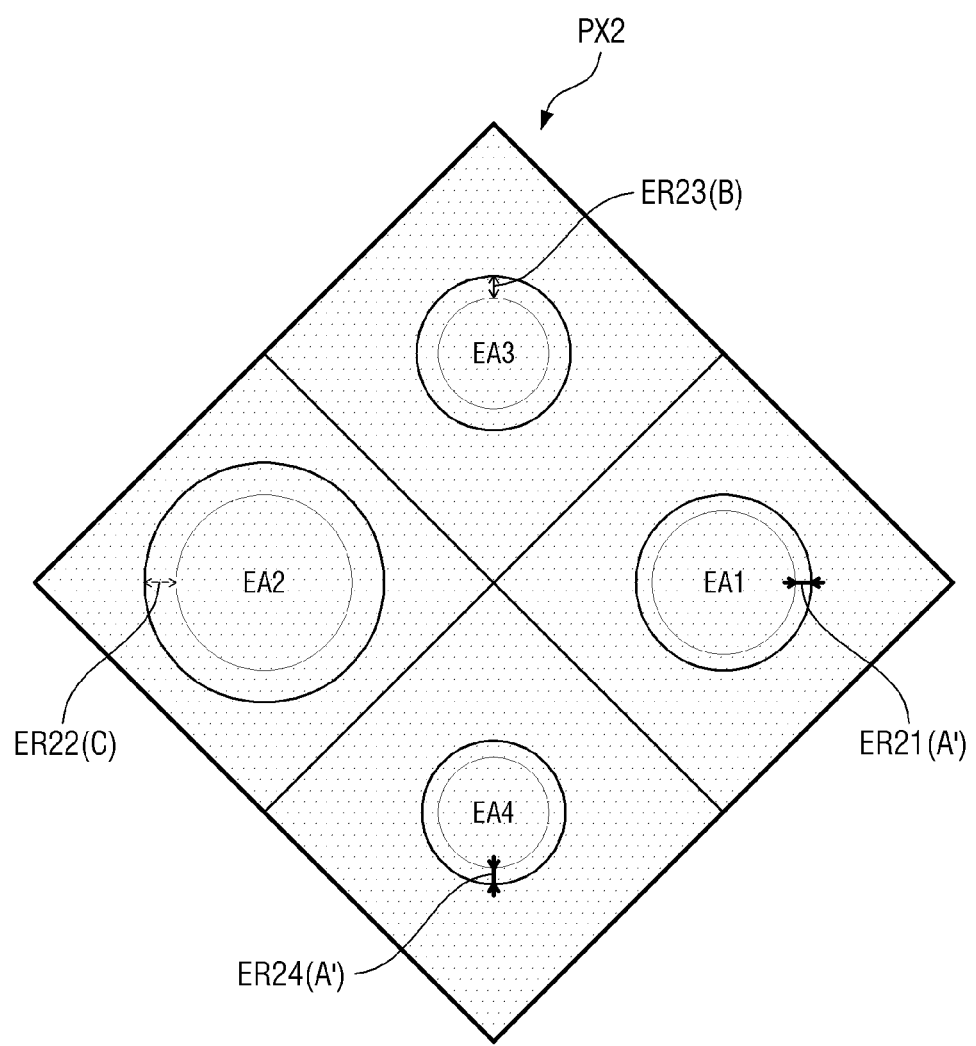
Figure 19:
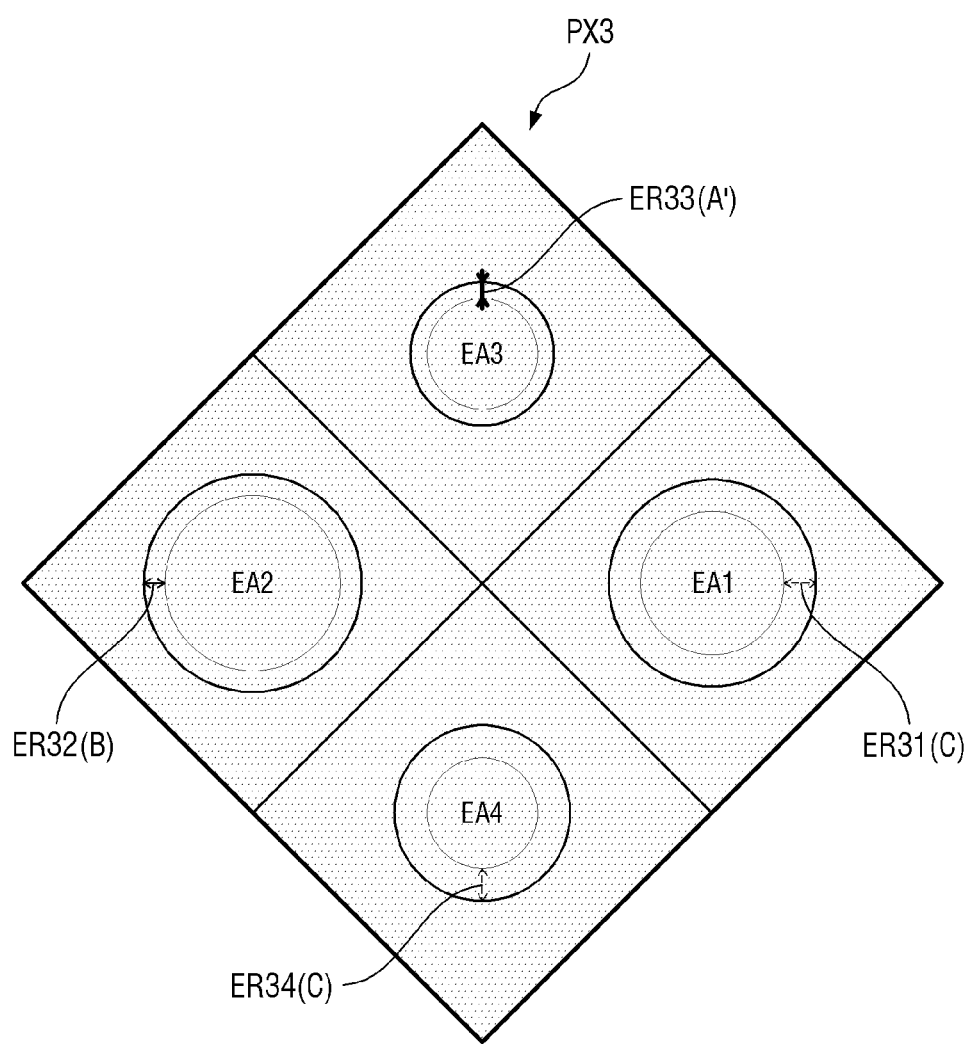

FIG. 16 is a plan view illustrating a disposition of emission areas of a first pixel, a second pixel, and a third pixel in a first display area of a display device according to another embodiment. FIGS. 17 to 19 are plan views illustrating the first pixel, the second pixel, and the third pixel of FIG. 16 in more detail, respectively.

Referring to FIGS. 16 to 19, in a display device 10_1 according to one embodiment, in each of the emission areas EA1, EA2, EA3, and EA4 of the first pixel PX1, the second pixel PX2, and the third pixel PX3, deviations of opening intervals of the emission areas EA1, EA2, EA3, and EA4 for emitting light of the same color may be different. The deviation or difference in opening intervals may be different among homogeneous openings or homogeneous emission areas. For example, the difference between the minimum opening interval and the intermediate opening interval may be different from the difference between the intermediate opening interval and the maximum opening interval.

The opening intervals ER of the different emission areas EA1, EA2, EA3, and EA4 from each other may be different from each other. As in the embodiment of FIGS. 11 to 14, in the first pixel PX1, the first opening interval ER11(B) of the first emission area EA1 may be different from each of the second opening interval ER12(A') of the second emission area EA2 and the third opening interval ER13(C) of the third emission area EA3 in the first pixel PX1. In the second pixel PX2, the first opening interval ER21(A') of the first emission area EA1 may be different from each of the second opening interval ER22(C) of the second emission area EA2 and the third opening interval ER23(B) of the third emission area EA3 in the second pixel PX2. In the third pixel PX3, the first opening interval ER31(C) of the first emission area EA1 may be different from each of the second opening interval ER32(B) of the second emission area EA2 and the third opening interval ER33(A') of the third emission area EA3 in the third pixel PX3.

In the plurality of emission areas EA1, EA2, EA3, and EA4, the size of the opening interval ER and the deviation between the different opening intervals ER may be designed in various ways according to the color required for the display device 10. In an embodiment, the plurality of emission areas EA1, EA2, EA3, and EA4 may have three different opening intervals ER from each other, and regardless of the wavelength band of light emitted from the emission areas EA1, EA2, EA3, and EA4, the sizes of the three opening intervals ER may be the same.

For example, in the first to third pixels PX1, PX2, and PX3, the emission area having the smallest opening interval may be the second emission area EA2 of the first pixel PX1, the first emission area EA1 and the fourth emission area EA4 of the second pixel PX2, and the third emission area EA3 of the third pixel PX3. The smallest size of the opening interval of the above-described emission areas may be referred to as a "minimum opening interval A'."

In the first to third pixels PX1, PX2, and PX3, the emission area having the largest opening interval may be the third emission area EA3 of the first pixel PX1, the second emission area EA2 of the second pixel PX2, and the first emission area EA1 and the fourth emission area EA4 of the third pixel PX3. The largest size of the opening interval of the above-described emission areas may be referred to as a "maximum opening interval C." In the first to third pixels PX1, PX2, and PX3, the emission area with an opening interval having an intermediate value may be the first emission area EA1 and the fourth emission area EA4 of the first pixel PX1, the third emission area EA3 of the second pixel PX2, and the second emission area EA2 of the third pixel PX3. An opening interval having an intermediate size of the above-described emission areas may be referred to as an "intermediate opening interval B."

According to one embodiment, in the display device 10_1, the difference B−A' between the minimum opening interval A' and the intermediate opening interval B of the emission areas EA1, EA2, EA3, and EA4 may be different from the difference C−B between the intermediate opening interval B and the maximum opening interval C. For example, the difference between the minimum opening interval A' and the intermediate opening B interval may be greater than the difference between the intermediate opening interval B and the maximum opening interval C. As described above, the deviation of the opening intervals may be in a range from about 0.5 μm to about 1 μm. In an embodiment, the difference C−B between the maximum opening interval C and the intermediate opening interval B may be about 1 μm, and the difference B−A' between the intermediate opening interval B and the minimum opening interval A' may be about 0.72 μm. As an example, the minimum opening interval A' may be 4 μm, the intermediate opening interval B may be about 5 μm, and the maximum opening interval C may be about 5.72 μm. In order to offset the diffracted light reflected by external light, the display device 10_1 according to one embodiment may have the deviation of the opening intervals ER among the emission areas EA1, EA2, EA3, and EA4 for emitting light of the same color, but the deviation among the opening intervals ER may not be constant and may vary.

Figure 20:
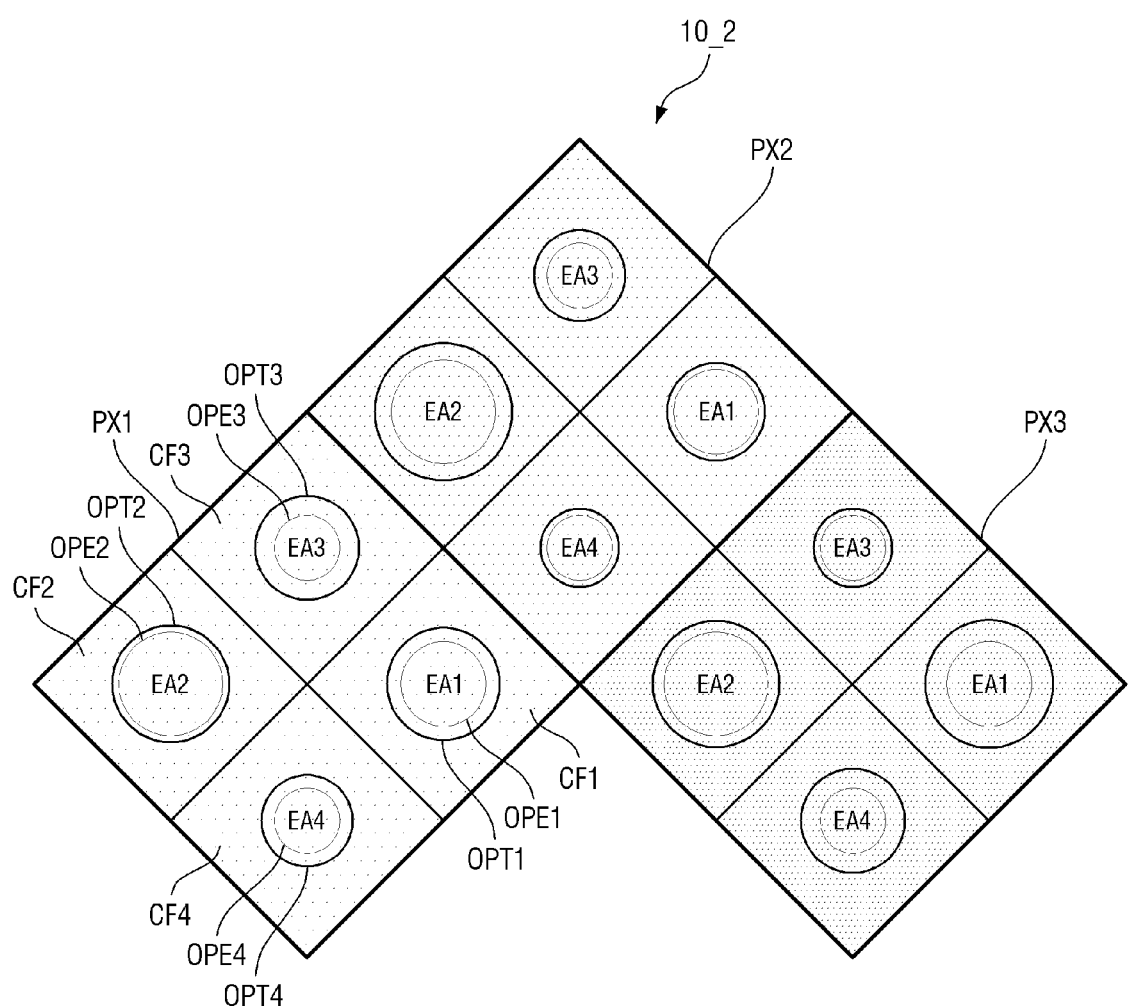
FIG. 20 is a plan view illustrating a disposition of emission areas of a first pixel, a second pixel, and a third pixel in a first display area of a display device according to still another embodiment.
Figure 21:
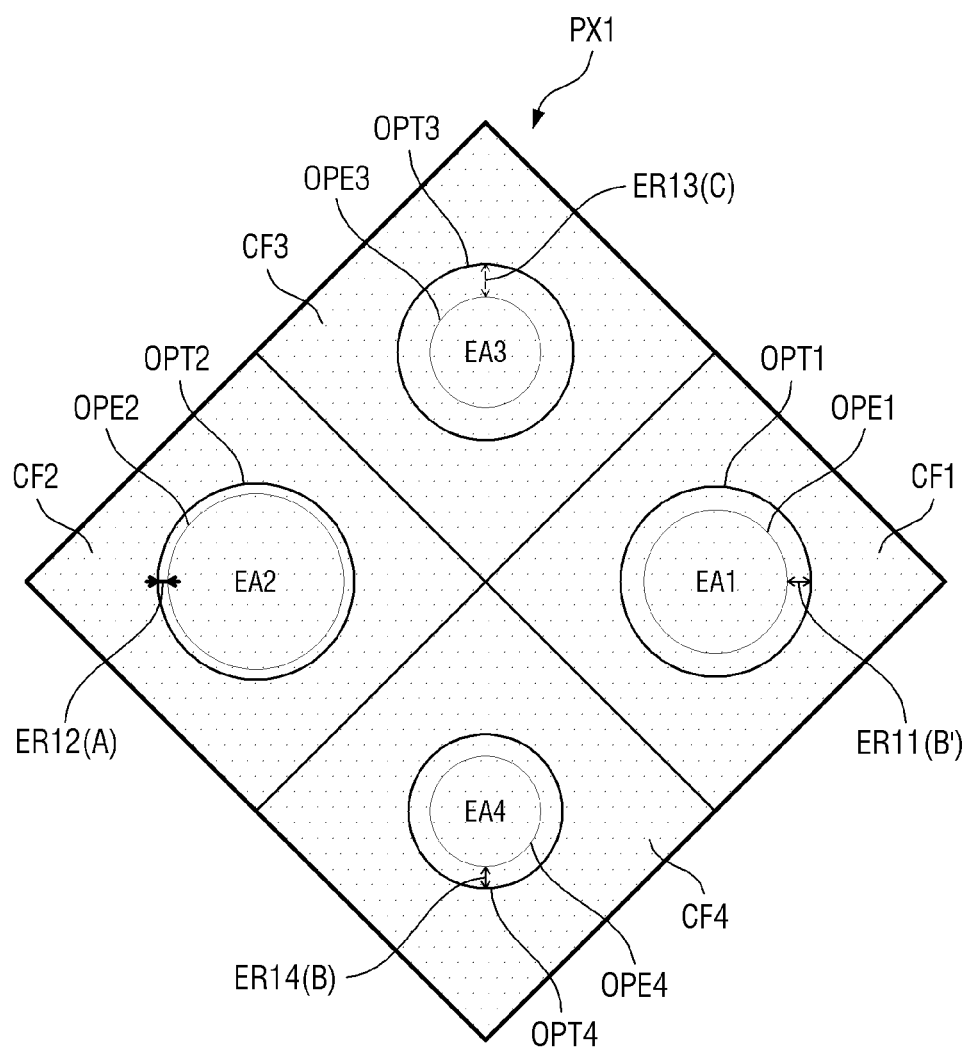
FIGS. 21 to 23 are plan views illustrating the first pixel, the second pixel, and the third pixel of FIG. 20 in more detail, respectively.
Figure 22:
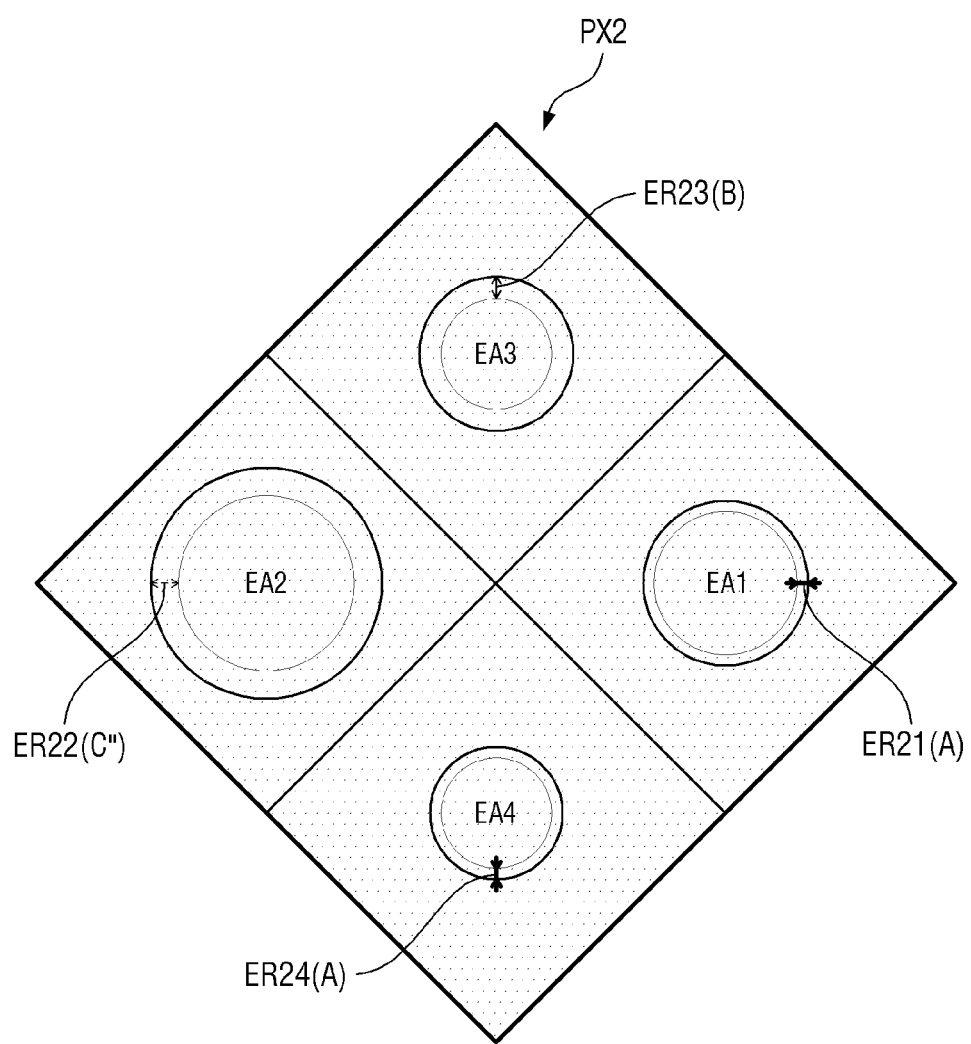
Figure 23:
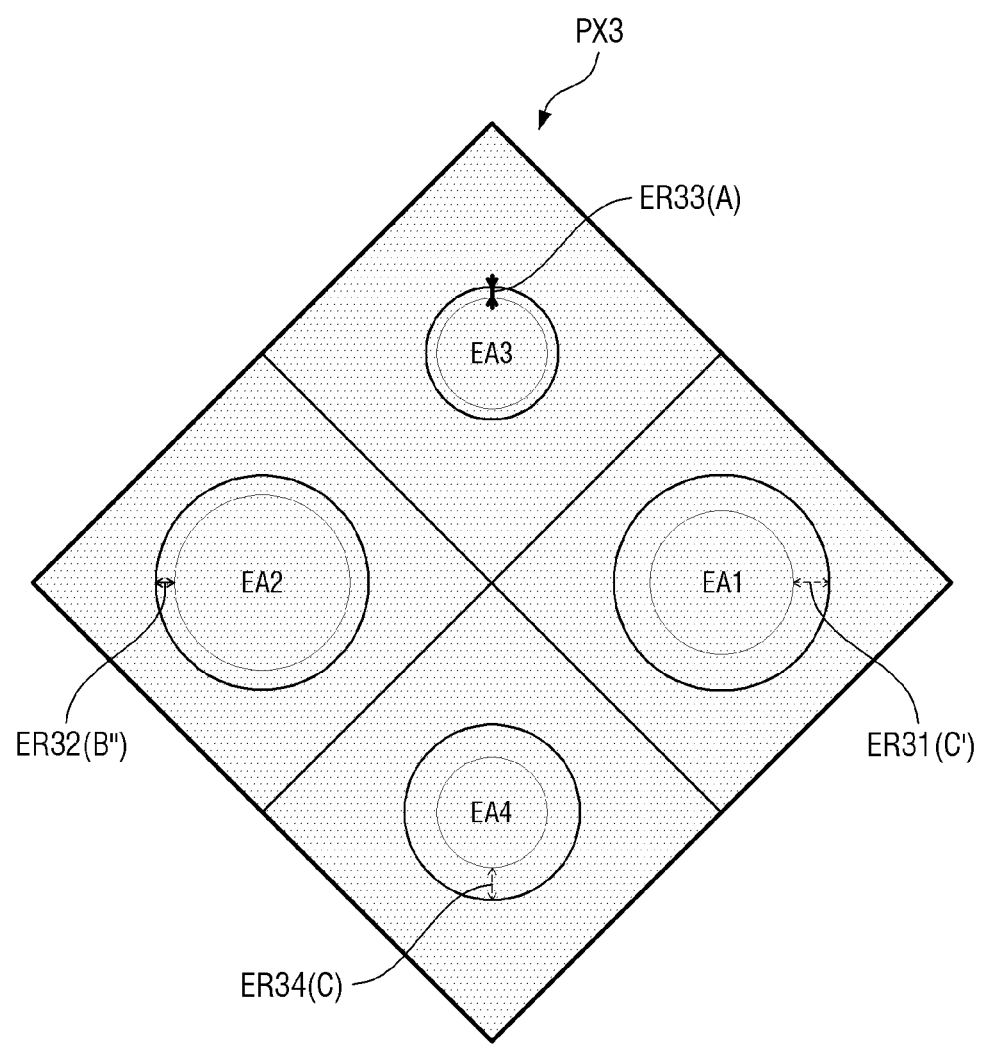

FIG. 20 is a plan view illustrating a disposition of emission areas of a first pixel, a second pixel, and a third pixel in a first display area of a display device according to still another embodiment. FIGS. 21 to 23 are plan views illustrating the first pixel, the second pixel, and the third pixel of FIG. 20 in more detail, respectively.

Referring to FIGS. 20 to 23, in a display device 10_2 according to one embodiment, the deviation of the opening interval ER may be different among the emission areas EA1, EA2, EA3, and EA4 for emitting light of different colors from each other in the first pixel PX1, the second pixel PX2, and the third pixel PX3. In the above-described embodiments, regardless of the color of the light emitted from the emission areas EA1, EA2, EA3, and EA4, the opening interval ER of each of the light emission areas EA1, EA2, EA3, and EA4 and the deviation of the opening intervals ER may be designed. However, since the light reflected from the emission areas EA1, EA2, EA3, and EA4 passes through the color filters CF1, CF2, CF3, and CF4 and has a specific color, a position at which the diffraction pattern of the reflected light is formed and the phase thereof may be related to the colors of the emission areas EA1, EA2, EA3, and EA4 and the color filters CF1, CF2, CF3, and CF4. In consideration of the above, in the display device 10_2 according to one embodiment, the "deviation" of the opening intervals ER may be different among the emission areas EA1, EA2, EA3, and EA4 for emitting light of different colors from each other. That is, different types of the heterogeneous openings may have different deviations in opening intervals among the homogeneous openings. This may mean that the heterogeneous openings have different deviations in the minimum, intermediate, and maximum opening intervals.

For example, the opening intervals ER of the different emission areas EA1, EA2, EA3, and EA4 may be different from each other. In the first pixel PX1, each of the opening intervals ER11, ER12, ER13, and ER14 of the emission areas EA1, EA2, EA3, and EA4 may be different. In the first pixel PX1, the opening interval ER12(A) of the second emission area EA2 may be the smallest, and sizes may increase in the order of the opening interval ER14(B) of the fourth emission area EA4, the opening interval ER11(B') of the first emission area EA1, and the opening interval ER13 (C) of the third emission area EA3.

In the second pixel PX2, the opening intervals ER21(A) and ER24(A) of the first emission area EA1 and the fourth emission area EA4 may be the same, and may be different from the opening interval ER22(C") of the second emission area EA2 and the opening interval ER23(B) of the third emission area EA3. In the second pixel PX2, the opening intervals ER21(A) and ER24(A) of the first emission area EA1 and the fourth emission area EA4 may be the smallest, and sizes may increase in the order of the opening interval ER23(B) of the third emission area EA3 and the opening interval ER22(C") of the second emission area EA2.

In the third pixel PX3, each of the opening intervals ER31, ER32, ER33, and ER34 of the emission areas EA1, EA2, EA3, and EA4 may be different. In the third pixel PX3, the opening intervals ER33(A) of the third emission area EA3 may be the smallest, and sizes may increase in the order of the opening interval ER32(B") of the second emission area EA2, the opening interval ER34(C) of the fourth emission area EA4, and the opening interval ER31(C') of the first emission area EA1.

In the embodiment, the first to fourth emission areas EA1, EA2, EA3, and EA4 have the same minimum opening interval A, but the intermediate opening intervals B, B', and B" and the maximum opening interval C, C', and C" may have different sizes from each other. This may be because the deviation of the opening intervals ER in the first to fourth emission areas EA1, EA2, EA3, and EA4 varies depending on the wavelength of light emitted from the emission areas EA1, EA2, EA3, and EA4.

In an embodiment, the deviation of the opening interval ER of each of the emission areas EA1, EA2, EA3, and EA4 for emitting red light of the first color, blue light of the second color, and green light of the third color may have a ratio of 1:0.73:0.86. The deviation between the opening intervals ER of the third emission area EA3 and the fourth emission area EA4 for emitting the green light of the third color may be about 0.5 μm. Based on the above, the deviation of the opening interval ER of the first emission area EA1 for emitting the red light of the first color may be about 0.58 μm, and the deviation of the opening interval ER of the second emission area EA2 for emitting the blue light of the second color may be about 0.42 µm. Accordingly, in the first to fourth emission areas EA1, EA2, EA3, and EA4, the sizes of the minimum opening intervals may be the same regardless of the color of the emitted light, but the sizes of the intermediate opening interval and the maximum opening interval may be different from each other.

For example, the opening interval ER11 (B') of first emission area EA1 of the first pixel PX1 having an intermediate opening interval among the first emission areas EA1 may be greater than the opening interval ER23(B) of the third emission area EA3 of the second pixel PX2 having an intermediate opening interval among the third emission areas EA3. The opening interval ER23(B) of the third emission area EA3 of the second pixel PX2 having an intermediate opening interval among the third emission areas EA3 may be greater than the opening interval ER32 (B") of the second emission area EA2 of the third pixel PX3 having an intermediate opening interval among the second emission areas EA2.

The opening interval ER31(C') of the first emission area EA1 of the third pixel PX3 having a maximum opening interval among the first emission areas EA1 may be greater than the opening interval ER13(C) of the third emission area EA3 of the first pixel PX1 having a maximum opening interval among the third emission areas EA3. The opening interval ER13(C) of the third emission area EA3 of the first pixel PX1 having a maximum opening interval among the third emission areas EA3 may be greater than the opening interval ER22(C") of the second emission area EA2 of the second pixel PX2 having a maximum opening interval among the second emission areas EA2.

Figure 24:
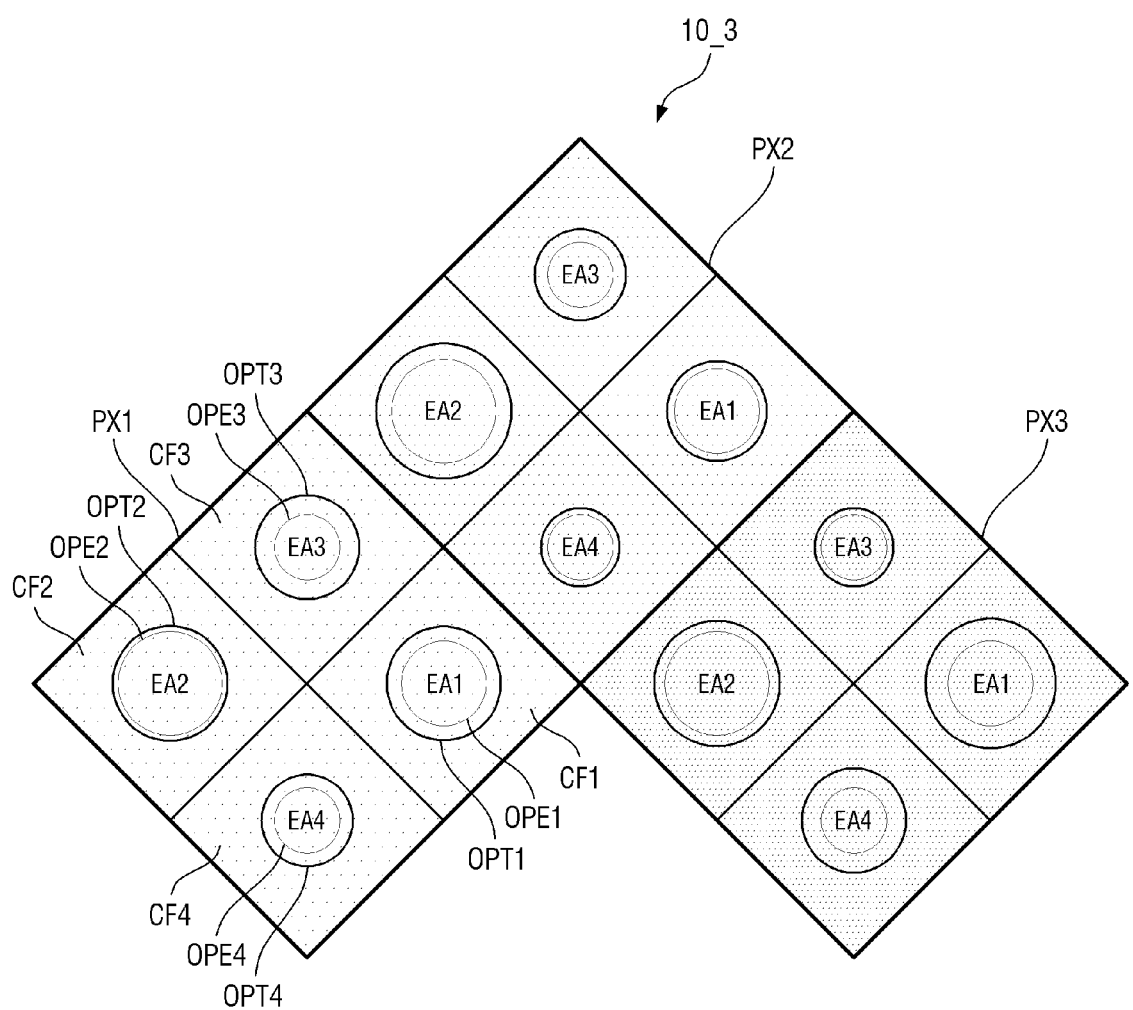
FIG. 24 is a plan view illustrating a disposition of emission areas of a first pixel, a second pixel, and a third pixel in a first display area of a display device according to still another embodiment.
Figure 25:
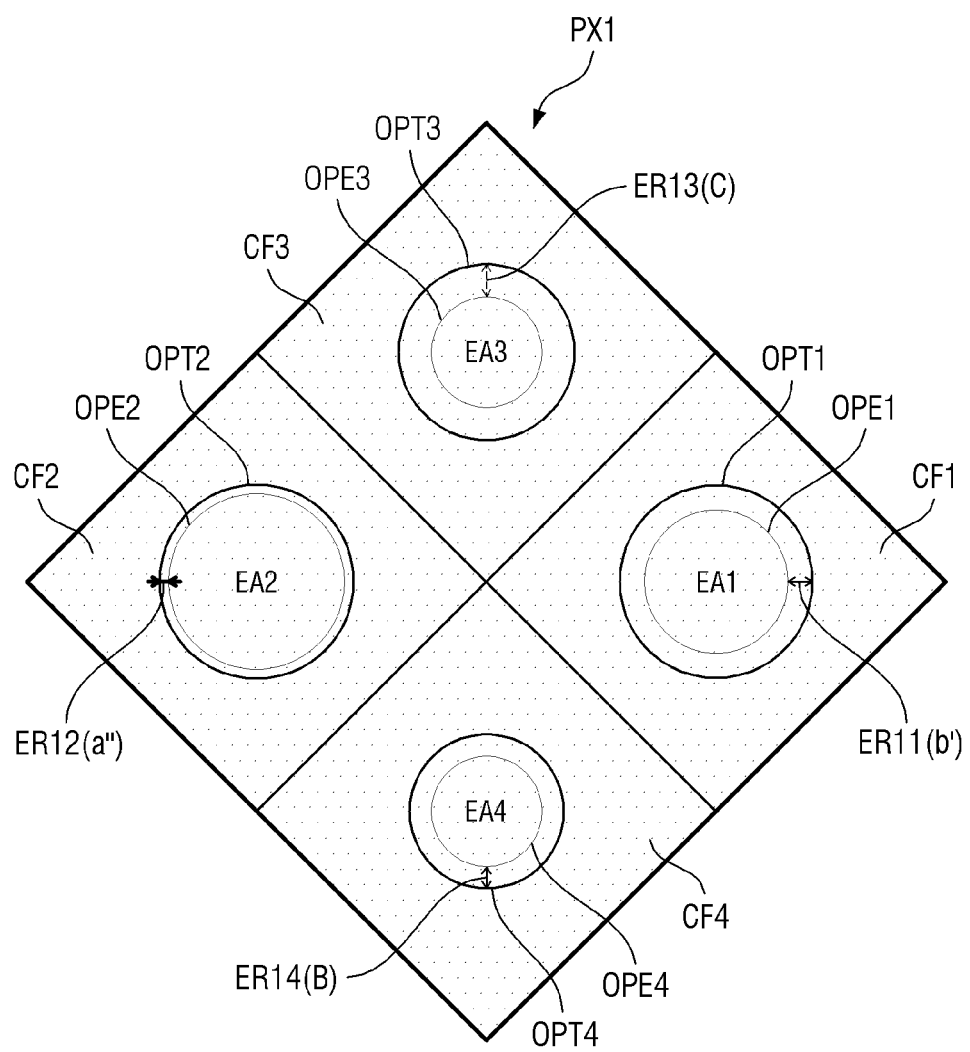
FIGS. 25 to 27 are plan views illustrating the first pixel, the second pixel, and the third pixel of FIG. 24 in more detail, respectively.
Figure 26:
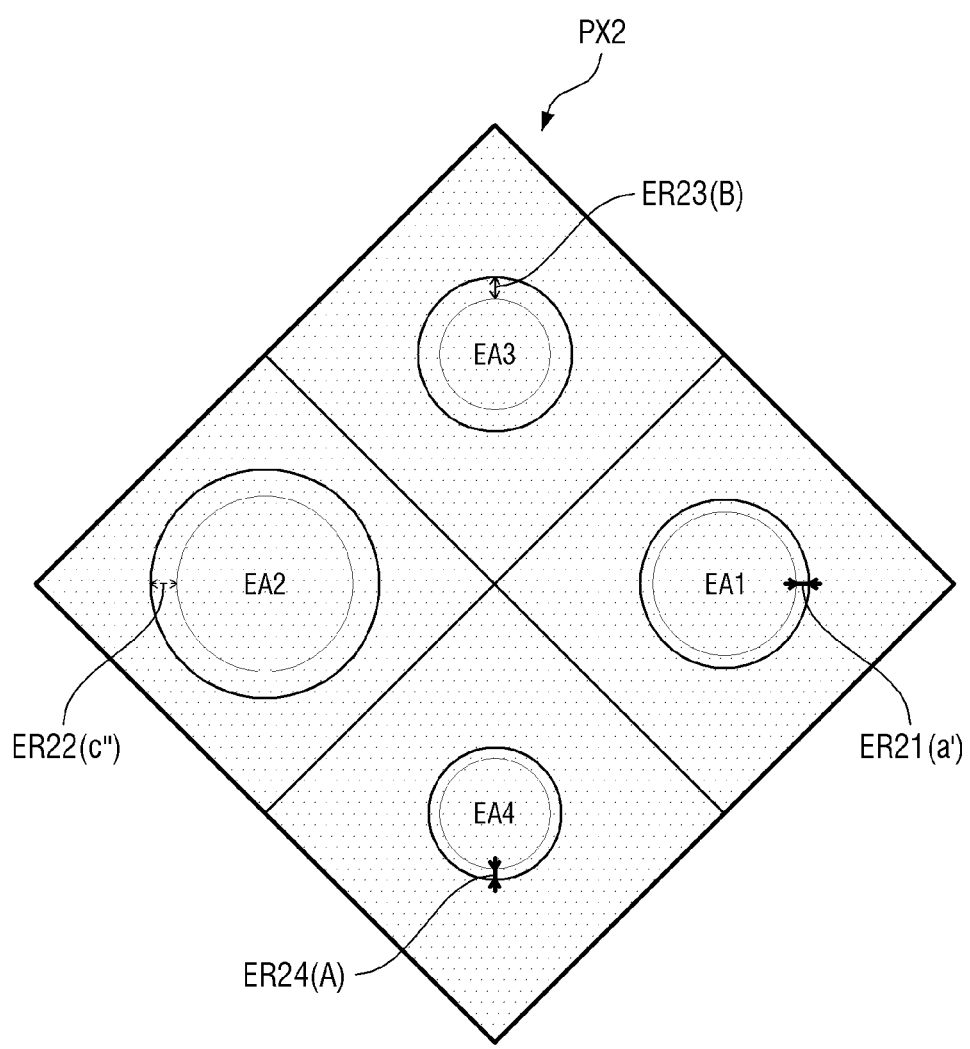
Figure 27:
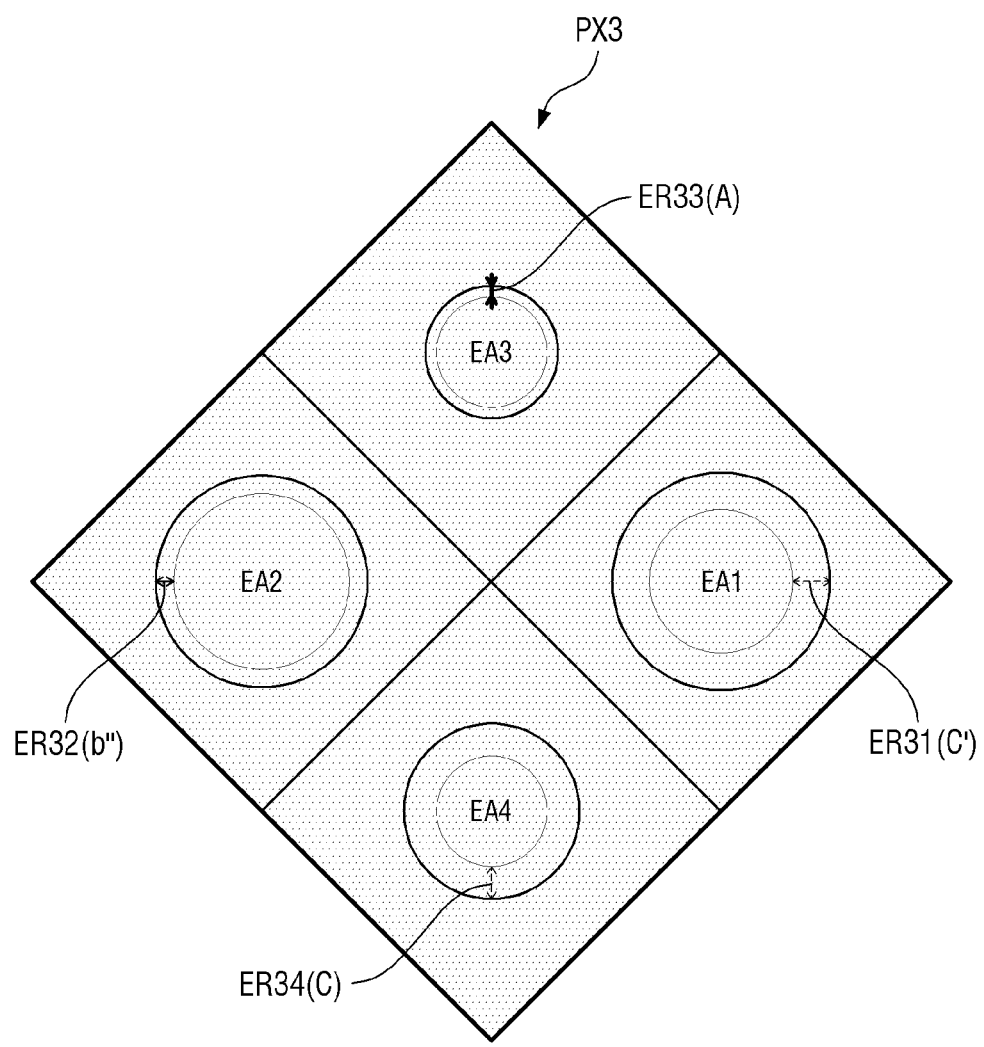

FIG. 24 is a plan view illustrating a disposition of emission areas of a first pixel, a second pixel, and a third pixel in a first display area of a display device according to still another embodiment. FIGS. 25 to 27 are plan views illustrating the first pixel, the second pixel, and the third pixel of FIG. 24 in more detail, respectively.

Referring to FIGS. 24 to 27, in a display device 10_3 according to one embodiment, the opening intervals ER may be different among the emission areas EA1, EA2, EA3, and EA4 for emitting light of different colors in the first pixel PX1, the second pixel PX2, and the third pixel PX3. In the embodiments of FIGS. 20 to 23, the deviation of the opening intervals ER may be different among the emission areas EA1, EA2, EA3, and EA4 for emitting light of different colors. On the other hand, in the embodiment of FIGS. 24 to 27, although the deviation of the opening intervals ER among the emission areas EA1, EA2, EA3, and EA4 for emitting light of different colors may be the same, the size of each of the opening intervals ER may be different. That is, the heterogeneous openings may have different opening intervals, respectively. However, the deviation of the opening intervals among the homogeneous openings may be the same regardless of the type of the heterogeneous openings.

In an embodiment, the opening interval ER of each of the emission areas EA1, EA2, EA3, and EA4 for emitting red light of the first color, blue light of the second color, and green light of the third color may have a ratio of 1:0.73:0.86. The third emission area EA3 or the fourth emission area EA4 for emitting green light of the third color may have the minimum opening interval A of about 5.22 µm and the deviation of the opening interval ER of about 0.5 µm. The third emission area EA3 and the fourth emission area EA4 may have the intermediate opening interval B of about 5.72 µm or the maximum opening interval C of about 6.22 µm.

Based on the above, the first emission area EA1 for emitting the red light of the first color may have a minimum opening interval a' of about 6.15 µm and the deviation of the opening interval ER of about 0.5 µm. In another embodiment, the first emission area EA1 may have an intermediate opening interval b' of about 6.65 µm or a maximum opening interval c' of about 7.15 µm. The second emission area EA2 for emitting blue light of the second color may have the minimum opening interval a" of about 4.3 µm and the deviation of the opening interval ER of about 0.5 µm. The second emission area EA2 may have the intermediate opening interval b" of about 4.8 µm or the maximum opening interval c" of about 5.3 µm.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
    a plurality of pixels comprising a plurality of emission areas in which light emitting elements for emitting light are disposed and arranged in a first direction and a second direction crossing the first direction;
    a light blocking layer disposed between the emission areas adjacent to each other, and defining a plurality of holes, wherein each of the holes overlaps a corresponding emission area of the emission areas and has a different diameter from the corresponding emission area; and
    a plurality of color filters disposed in the holes of the light blocking layer and overlapping the emission areas,
    wherein the emission areas comprise a plurality of first emission areas for emitting light of a first color, a plurality of second emission areas for emitting light of a second color having a shorter wavelength band than the light of the first color, a plurality of third emission areas for emitting light of a third color having a wavelength band between the light of the first color and the light of the second color, and a plurality of fourth emission areas for emitting light of the third color,
    the plurality of holes comprises first holes overlapping the first emission areas, second holes overlapping the second emission areas, third holes overlapping the third emission areas, and fourth holes overlapping the fourth emission areas,
    in one of the pixels in a plan view, a first opening interval between a corresponding first emission area of the first emission areas and a corresponding first hole of the first holes, a second opening interval between a corresponding second emission area of the second emission areas and a corresponding second hole of the second holes, and a third opening interval between a corresponding third emission area of the third emission areas and a corresponding third hole of the third holes are different from each other, and
    a corresponding fourth emission area of the fourth emission areas is differently sized from the corresponding third emission area of the third emission areas and a corresponding fourth hole of the fourth holes is differently sized from the corresponding third hole of the third holes such that a fourth opening interval between the corresponding fourth emission area and the corresponding fourth hole is different from the third opening interval.

2. The display device of claim 1, wherein in the plurality of pixels, the emission areas for emitting light of a same color have different opening intervals, and among the emission areas for emitting light of the same color, the emission areas having different opening intervals are at least three types of emission areas.

3. The display device of claim 2, wherein in the plurality of emission areas arranged in the first direction or the second direction,
the emission areas adjacent to each other in the first direction or the second direction and for emitting light of the same color have different opening intervals.

4. The display device of claim 1, wherein diameters of the first emission area, the second emission area, and the third emission area are different from each other.

5. The display device of claim 1, wherein the first opening interval, the second opening interval, and the third opening interval each are in a range of about 3 micrometers (μm) to about 10 μm.

6. The display device of claim 1, wherein a difference in opening intervals of the emission areas for emitting light of a same color is in a range of about 0.5 μm to about 1 μm.

7. The display device of claim 6, wherein a difference in the opening intervals of the emission areas for emitting light of the same color is constant.

8. The display device of claim 6, wherein a difference between a minimum opening interval and an intermediate opening interval among the opening intervals of the emission areas for emitting light of the same color is different from a difference between the intermediate opening interval and a maximum opening interval among the opening intervals of the emission areas for emitting light of the same color.

9. The display device of claim 1, wherein a minimum opening interval among first opening intervals of the first emission areas is equal to each of a minimum opening interval among second opening intervals of the second emission areas and a minimum opening interval among third opening intervals of the third emission areas.

10. The display device of claim 9, wherein an opening interval deviation of the first opening intervals is equal to each of an opening interval deviation of the second opening intervals and an opening interval deviation of the third opening intervals.

11. The display device of claim 9, wherein an opening interval deviation of the first opening intervals is different from each of an opening interval deviation of the second opening intervals and an opening interval deviation of the third opening intervals.

12. The display device of claim 11, wherein a ratio of the opening interval deviation of the first opening intervals, the opening interval deviation of the second opening intervals, and the opening interval deviation of the third opening intervals is 1:0.73:0.86.

13. The display device of claim 1, wherein a polarization layer is not disposed on the plurality of pixels.

14. The display device of claim 6, wherein the plurality of color filters are disposed to overlap the emission areas which emit light of the same color, but have different opening intervals, and
the plurality of color filters overlapping the emission areas having different opening intervals comprise middle portions having different thicknesses.

15. A display device comprising:
a pixel defining layer defining a plurality of openings therein arranged in a first direction and a second direction crossing the first direction, the plurality of openings forming a plurality of emission areas in which a plurality of light emitting elements are disposed to emit light of different colors;
a light blocking layer disposed on the pixel defining layer, and defining a plurality of holes therein, wherein each of the holes overlaps a corresponding opening of the openings and has a larger diameter than the corresponding opening; and
a plurality of color filters disposed on the light blocking layer to overlap the holes and overlap the emission areas,
wherein the corresponding opening has an opening interval, which is defined as a difference in diameter between the overlapping hole and the corresponding opening,
in the plurality of openings, among homogeneous openings in which the light emitting elements for emitting light of a same color are disposed, the homogeneous openings adjacent in the first direction or the second direction are differently sized and have different opening intervals, and
among the homogeneous openings, openings having different opening intervals are at least three types.

16. The display device of claim 15, wherein a difference in the opening intervals between the openings having the different opening intervals among the homogeneous openings is in a range of about 0.5 μm to about 1 μm.

17. The display device of claim 16, wherein a difference in the opening intervals between the openings having the different opening intervals among the homogeneous openings is constant.

18. The display device of claim 15, wherein the plurality of openings comprises a plurality of first openings in each of which a first light emitting element for emitting light of a first color is disposed, and a plurality of second openings in each of which a second light emitting element for emitting light of a second color different from the first color is disposed and having a different diameter from the first opening,
the plurality of first openings comprise homogeneous first openings having different opening intervals, and
the plurality of second openings comprise homogeneous second openings having different opening intervals.

19. The display device of claim 18, wherein the opening interval of each of the homogeneous first openings is equal to the opening interval of each of the homogeneous second openings.

20. The display device of claim 18, wherein a deviation in the opening interval of the homogeneous first openings is different from a deviation in the opening interval of the homogeneous second openings.

21. The display device of claim 20, wherein the opening interval of each of the homogeneous first openings is different from the opening interval of each of the homogeneous second openings.

22. The display device of claim 18, wherein a deviation in the opening interval of the homogeneous first openings is equal to a deviation in the opening interval of the homogeneous second openings.

23. The display device of claim 15, wherein a polarization layer is not disposed on the pixel defining layer.

24. The display device of claim 18, wherein the plurality of color filters comprises a plurality of first color filters disposed on the plurality of first openings, and
the plurality of first color filters disposed on the homogeneous first openings having different opening intervals comprise middle portions having different thicknesses.

25. The display device of claim 1, wherein, in the one of the pixels in the plan view, the first opening interval around an entire perimeter of the first emission area is different from the second opening interval around an entire perimeter of the second emission area and the third opening interval around an entire perimeter of the third emission area, and the second opening interval around the entire perimeter of the second emission area is different from the third opening interval around the entire perimeter of the third emission area.

26. The display device of claim 25, wherein, in the one of the pixels in the plan view, the first opening interval is constant around the entire perimeter of the first emission area, the second opening interval is constant around the entire perimeter of the second emission area, and the third opening interval is constant around the entire perimeter of the third emission area.

27. The display device of claim 15, wherein the homogeneous openings adjacent in the first direction or the second direction have different opening intervals around an entire perimeter thereof.

28. The display device of claim 15, wherein each of the homogeneous openings adjacent in the first direction or the second direction have opening intervals that are constant around the entire perimeter thereof.

* * * * *